(12) United States Patent
Ishizaka

(10) Patent No.: US 9,779,950 B2
(45) Date of Patent: Oct. 3, 2017

(54) RUTHENIUM FILM FORMING METHOD, FILM FORMING APPARATUS, AND SEMICONDUCTOR DEVICE MANUFACTURING METHOD

(71) Applicant: Tokyo Electron Limited, Tokyo (JP)

(72) Inventor: Tadahiro Ishizaka, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/043,675

(22) Filed: Feb. 15, 2016

(65) Prior Publication Data

US 2016/0240433 A1    Aug. 18, 2016

(30) Foreign Application Priority Data

Feb. 16, 2015    (JP) ................................ 2015-027180

(51) Int. Cl.
*H01L 21/00*    (2006.01)
*H01L 21/285*    (2006.01)
(Continued)

(52) U.S. Cl.
CPC ........ *H01L 21/28556* (2013.01); *C23C 16/16* (2013.01); *C23C 16/4481* (2013.01);
(Continued)

(58) Field of Classification Search
CPC ......... H01L 21/28556; H01L 21/76846; H01L 21/76843; H01L 23/53238
See application file for complete search history.

(56) References Cited

U.S. PATENT DOCUMENTS 7,279,421 B2 * 10/2007 Suzuki .................... C23C 16/16
                                                    257/E21.021
7,482,269 B2    1/2009 Suzuki
(Continued)

FOREIGN PATENT DOCUMENTS

JP    2007-507613 A    3/2007
JP    2008-091899 A    4/2008
(Continued)

OTHER PUBLICATIONS

Babar, et al. "Growth Inhibitor to Hemogenize Nucleation and Obtain Smooth HfB2 Thin Films by Chemical Vapor Deposition, Chemistry of Materials", Department of Materials Science and Engineering, University of Illinois, 2013, pp. 662-667.

*Primary Examiner* — Richard Booth
(74) *Attorney, Agent, or Firm* — Pearne & Gordon LLP

(57) ABSTRACT

A ruthenium film forming method includes a deposition process of introducing a mixed gas of a ruthenium carbonyl gas and a CO gas into a processing vessel 1 by supplying the CO gas as a carrier gas from a CO gas container 43 configured to contain the CO gas into a film forming source container 41 configured to contain ruthenium carbonyl in a solid state as a film forming source material, and forming ruthenium film by decomposing the ruthenium carbonyl on a wafer W; and a CO gas introduction process of bringing the CO gas into contact with a surface of the wafer W by introducing the CO gas directly into the processing vessel 1 from the CO gas container 43 after stopping the introducing of the mixed gas into the processing vessel 1. The deposition process and the CO gas introduction process are repeated multiple times.

11 Claims, 15 Drawing Sheets

(51) Int. Cl.
  *C23C 16/16* (2006.01)
  *C23C 16/448* (2006.01)
  *C23C 16/455* (2006.01)
  *H01L 23/532* (2006.01)
  *H01L 21/768* (2006.01)

(52) U.S. Cl.
  CPC .. *C23C 16/45523* (2013.01); *C23C 16/45561* (2013.01); *H01L 21/76843* (2013.01); *H01L 23/53238* (2013.01)

(56) References Cited

U.S. PATENT DOCUMENTS

| | | | |
|---|---|---|---|
| 7,745,332 B1* | 6/2010 | Shaviv | H01L 21/2855 257/E21.161 |
| 2005/0069641 A1* | 3/2005 | Matsuda | C23C 16/16 427/226 |
| 2012/0064717 A1* | 3/2012 | Kato | C23C 16/16 438/675 |

FOREIGN PATENT DOCUMENTS

| | | |
|---|---|---|
| JP | 2008-514814 A | 5/2008 |
| JP | 2010-212601 A | 9/2010 |
| JP | 2012-169590 A | 9/2012 |
| WO | 2005/034222 A1 | 4/2005 |
| WO | 2006/036865 A2 | 4/2006 |

\* cited by examiner

RUTHENIUM FILM FORMING METHOD, FILM FORMING APPARATUS, AND SEMICONDUCTOR DEVICE MANUFACTURING METHOD

CROSS-REFERENCE TO RELATED APPLICATION

This application claims the benefit of Japanese Patent Application No. 2015-027180 filed on Feb. 16, 2015, the entire disclosures of which are incorporated herein by reference.

TECHNICAL FIELD

The embodiments described herein pertain generally to a ruthenium film forming method, a film forming apparatus, and a semiconductor device manufacturing method.

BACKGROUND

To meet a recent demand for high speed and high integration of a semiconductor device and high miniaturization of a wiring pattern thereof, a copper (Cu) multilayered wiring technology is attracting attention. In this technology, copper, which has high conductivity and high electromigration resistance, is used as a wiring material, and a low-dielectric film (Low-k film) is used as an interlayer insulating film.

As a method for forming a copper wiring, there is known a technique in which a barrier layer made of, for example, Ta, TaN or Ti is formed on an interlayer insulating film having a trench or a hole by a physical vapor deposition (PVD) method; a ruthenium film as a liner film is formed on the barrier layer by a chemical vapor deposition (CVD) method; and a copper film is formed on the ruthenium film by the PVD method (see, for example, Patent Document 1). The ruthenium film formed by the CVD method has higher step coverage than that of a ruthenium film formed by the PVD method and, also, has high adhesivity with the copper film. Thus, this ruthenium film has advantages as an underlying film when burying the copper film in the trench or the hole.

As a technique for forming the ruthenium film by the CVD method, there is proposed a method of using ruthenium carbonyl ($Ru_3(CO)_{12}$) as a film forming source material, while using an Ar gas as a carrier gas and using a hydrogen gas as a reducing gas (see, for example, Patent Document 2). Further, there is also proposed a method of using ruthenium carbonyl as a film forming source material and carbon monoxide (CO) as a carrier gas (see, for example, Patent Document 3). In a reaction system using the ruthenium carbonyl and the carbon monoxide, since impurity components in the film forming source material are restricted to carbon and oxygen, a film having high purity can be formed. Further, there is also proposed a method of using ruthenium carbonyl as a film forming source material and reducing the amount of residual carbon in a formed ruthenium film by performing annealing under a hydrogen gas atmosphere after the ruthenium film is formed (see, for example, Patent Document 4).

Moreover, though not related to a ruthenium film forming method, there is also proposed a method for reducing the amount of impurities in a film. In this method, by repeating a TiN film forming process of forming a TiN film to be used as an electrode for a storage node by using $TiCl_4$ as a source material and a treatment process under an ammonia gas atmosphere, the component of chlorine in the TiN film is reduced (see, for example, Patent Document 5). Furthermore, there is also known a by-product removal accelerating method. According to this method, in depositing a metal film by thermal decomposition of a metal carbonyl precursor, by repeatedly exposing the metal film to a reducing gas such as $SiH_4$, $BH_3$ or $NH_3$ during the formation of the metal film, the removal of the by-product introduced into the metal film is accelerated (see, for example, Patent Document 6).

In addition, also proposed is a technique of adding ammonia to a process of forming a $HfB_2$ film by the CVD method (see, for example, Non-patent Document 1). According to this method, it is deemed that nucleation is homogenized in the growth of the $HfB_2$ film by using the ammonia as the inhibitor and, thus, a smooth $HfB_2$ film can be formed.

Patent Document 1: Japanese Patent Laid-open Publication No. 2012-169590

Patent Document 2: Japanese Patent Laid-open Publication No. 2008-514814

Patent Document 3: U.S. Pat. No. 7,482,269

Patent Document 4: Japanese Patent Laid-open Publication No. 2010-212601

Patent Document 5: Japanese Patent Laid-open Publication No. 2008-091899

Patent Document 6: Japanese Patent Laid-open Publication No. 2007-507613

Non-patent Document 1: Growth Inhibitor To Homogenize Nucleation and Obtain Smooth $HfB_2$ Thin Films by Chemical Vapor Deposition, Chemistry of Materials 2013, 25, p662~667.

Recently, as a design rule of a semiconductor device is getting more miniaturized, a copper multilayered wiring structure is also getting miniaturized. In order to improve an operating speed of the semiconductor device and a signal transmission speed of the copper wiring while achieving the miniaturization thereof, it is required to suppress a RC delay. One of solutions for suppressing the RC delay is to reduce resistance of the wiring. As one of directions for achieving the low resistance of the copper wiring, it is deemed to be effective to maximize a volume of the copper wiring buried in a trench or a hole. To maximize the volume of the copper wiring, it is required to set a total thickness of a barrier film and a liner film to be as small as possible.

In the CVD method, however, if a thickness of the ruthenium film is reduced to, for example, 2 nm or less, the ruthenium films becomes discontinuous and may not exert a function as a liner film, so that a poor burial, such as a void, is generated in the copper wiring. In this regard, it is difficult to form a continuous ruthenium film in a thickness equal to or smaller than, e.g., 2 nm by the conventional CVD method, which may become a hindrance to achieving the low resistance of the copper wiring.

SUMMARY

In view of the foregoing, exemplary embodiments provide a method of forming a thin and continuous ruthenium film by a CVD method.

In one exemplary embodiment, a ruthenium film forming method of forming a ruthenium film includes a substrate loading process of placing a processing target substrate within a processing vessel of a film forming apparatus; a deposition process of generating a ruthenium carbonyl gas by supplying a CO gas as a carrier gas from a CO gas container configured to contain the CO gas into a film forming source container configured to contain ruthenium carbonyl in a solid state as a film forming source material, introducing a mixed gas of the ruthenium carbonyl gas and the CO gas into the processing vessel, and depositing metal ruthenium on a surface of the processing target substrate by decomposing the ruthenium carbonyl on the processing target substrate; and a CO gas introduction process of bringing the CO gas into contact with the metal ruthenium on the surface of the processing target substrate by introducing the CO gas directly into the processing vessel from the CO gas container after stopping the introducing of the mixed gas into the processing vessel.

The deposition process and the CO gas introduction process may be repeated multiple times.

When a time period indicating a processing time during which the deposition process is performed single time is set to be T1 and a time period indicating a processing time during which the CO gas introduction process is performed single time is set to be T2, the T1 and the T2 may satisfy a condition of T1<T2.

The ruthenium film forming method may further include a hydrogen gas introduction process of introducing a hydrogen gas into the processing vessel to bring the hydrogen gas into contact with the ruthenium film on the surface of the processing target substrate, after repeating the deposition process and the CO gas introduction process multiple times.

The deposition process may be conducted again until a preset film thickness is obtained, after repeating the deposition process and the CO gas introduction process multiple times.

When a time period indicating a processing time during which the deposition process is performed single time is set to be T1 and a time period indicating a processing time during which the CO gas introduction process is performed single time is set to be T2, the T2 may be shortened as the repetition number of the deposition process and the CO gas introduction process increases.

When a time period indicating a processing time during which the deposition process is performed single time is set to be T1 and a time period indicating a processing time during which the CO gas introduction process is performed single time is set to be T2, the T1 may be lengthened as the repetition number of the deposition process and the CO gas introduction process increases.

A thickness of the ruthenium film may be equal to or less than 2 nm.

In another exemplary embodiment, a film forming apparatus includes a processing vessel configured to accommodate a processing target substrate therein; a film forming source container configured to contain ruthenium carbonyl in a solid state as a film forming source material; a CO gas container configured to contain a CO gas; a film forming gas supply path configured to introduce a mixed gas of the CO gas and a ruthenium carbonyl gas, which is generated by introducing the CO gas as a carrier gas into the film forming source container, into the processing vessel; a CO gas supply path configured to introduce the CO gas from the CO gas container directly into the processing vessel without passing through the film forming source container; and a controller configured to perform a process of forming a ruthenium film within the processing vessel by a chemical vapor deposition method. Further, by switching the introduction of the mixed gas into the processing vessel through the film forming gas supply path and the introduction of the CO gas direct into the processing vessel through the CO gas supply path, the controller performs a deposition process of introducing the mixed gas into the processing vessel through the film forming gas supply path and depositing metal ruthenium on a surface of the processing target substrate by decomposing the ruthenium carbonyl, and the controller performs a CO gas introduction process of introducing the CO gas directly into the processing vessel through the CO gas supply path and bringing the CO gas into contact with the metal ruthenium on the surface of the processing target substrate after stopping the introducing of the mixed gas.

The controller may control the deposition process and the CO gas introduction process to be alternately repeated multiple times.

When a time period indicating a processing time during which the deposition process is performed single time is set to be T1 and a time period indicating a processing time during which the CO gas introduction process is performed single time is set to be T2, the controller may control the T1 and the T2 such that a condition of T1<T2 is satisfied.

In still another exemplary embodiment, a semiconductor device manufacturing method of manufacturing a semiconductor device having a copper wiring buried in an insulating film includes preparing a processing target substrate having an interlayer insulating film provided with an opening; forming a barrier film configured to suppress copper from being diffused on at least a surface of the opening of the processing target substrate; forming a ruthenium film on the barrier film; and burying copper serving as the copper wiring within the opening by forming a copper film on the ruthenium film. Further, the forming of the ruthenium film is performed by the above-described ruthenium film forming method.

The burying of the copper may be performed by an ionized physical vapor deposition method.

The semiconductor device manufacturing method may further include removing the barrier film, the ruthenium film and the copper film formed on portions except the inside of the opening by chemical mechanical polishing to obtain the copper wiring, after the burying of the copper.

According to the film forming apparatus and the ruthenium film forming method in accordance with the exemplary embodiments, it is possible to form a very thin and continuous ruthenium film having a thickness equal to or less than, e.g., 2 nm. Further, according to the semiconductor device manufacturing method in accordance with the exemplary embodiments, it is also possible to manufacture a semiconductor device having a highly reliable multilayered wiring structure while suppressing the RC delay even through the miniaturization of the wiring structure progresses.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
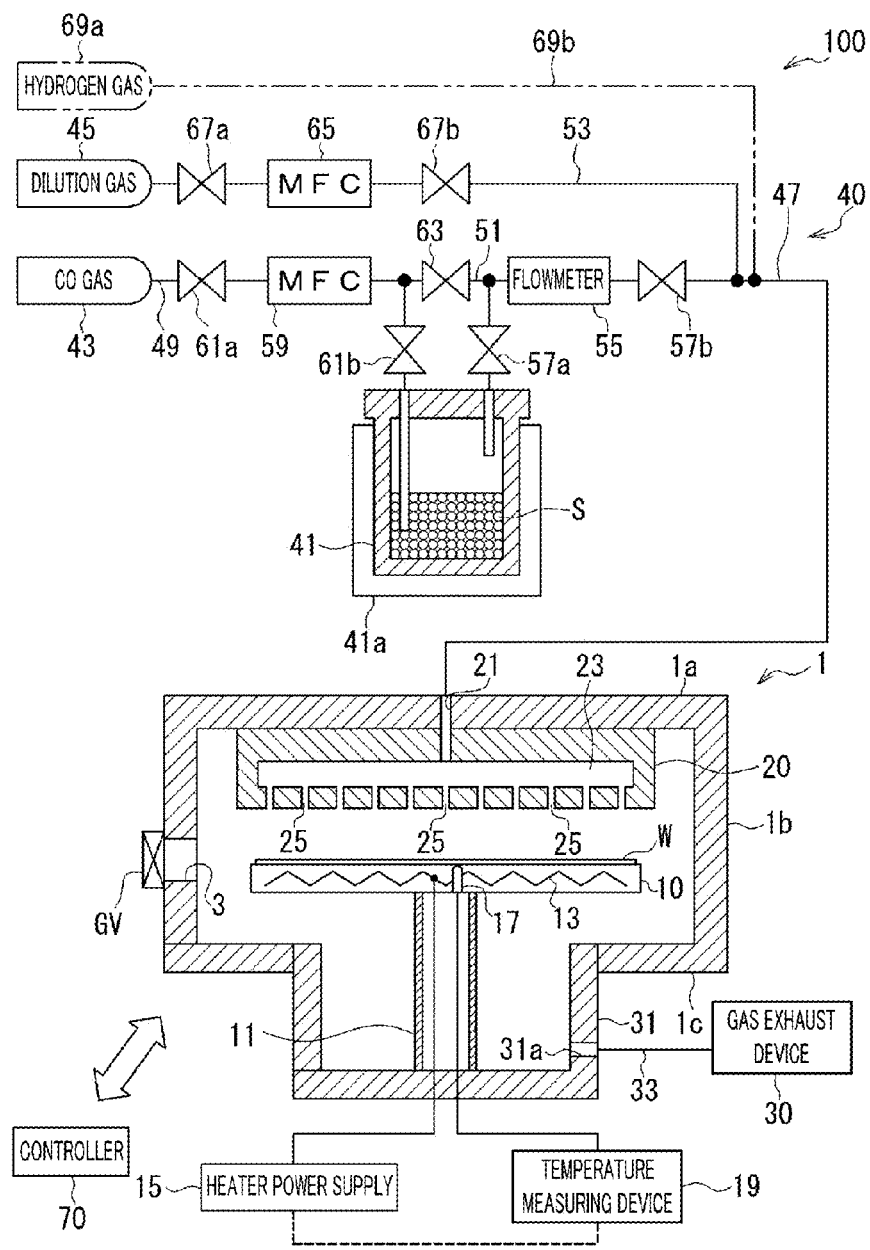
FIG. 1 is a cross sectional view illustrating a film forming apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

<Film Forming Apparatus of Forming Ruthenium Film>

FIG. 1 is a cross sectional view illustrating a film forming apparatus according to an exemplary embodiment. The film forming apparatus 100 is configured to form a ruthenium (Ru) film on a surface of a semiconductor wafer (hereinafter, simply referred to as "wafer") W as a processing target substrate by a CVD method while using ruthenium carbonyl as a source material.

The film forming apparatus 100 includes a hermetically sealed processing vessel 1; a susceptor 10 serving as a mounting table configured to mount thereon a wafer W horizontally within the processing vessel 1; a shower head 20 configured to introduce a processing gas for forming a ruthenium film by a CVD method into the processing vessel 1 in a shower shape; a gas exhaust device 30 configured to set the inside of the processing vessel 1 to a preset depressurized (vacuum) state; a gas supply unit 40 configured to supply the processing gas for forming the ruthenium film by the CVD method into the processing vessel 1; and a controller 70 configured to control individual components of the film forming apparatus 100.

<Processing Vessel>

The processing vessel 1 has a substantially cylindrical shape and has a ceiling wall 1a, a sidewall 1b and a bottom wall 1c. The sidewall 1b of the processing vessel 1 is provided with a carry-in/out opening 3 through which the wafer W is delivered between the processing vessel 1 and a transfer chamber (not shown) which is maintained in a preset depressurized state. The carry-in/out opening 3 is opened or closed by a gate valve GV.

<Susceptor>

The susceptor 10 is supported by a cylindrical supporting member 11 which is provided at a center of the bottom wall 1c of the processing vessel 1. The susceptor 10 has a heater 13 of, for example, a resistance heating type, and the heater 13 is connected to a heater power supply 15. Further, the susceptor 10 is provided with a thermocouple 17. The thermocouple 17 is connected to a temperature measuring device 19. The temperature measuring device 19 measures a temperature of the susceptor 10 based on a detection signal of the thermocouple 17 provided at the susceptor 10. By controlling the heater power supply 15 based on the measured temperature, the wafer W can be adjusted to have a preset temperature via the susceptor 10. The susceptor 10 is provided with three elevating pins (not shown) configured to be protruded from or retracted below a surface of the susceptor 10. The wafer W can be moved up and down while being supported on the three elevating pins.

<Shower Head>

The shower head 20 configured to introduce the processing gas for forming a ruthenium film by the CVD into the processing vessel 1 is provided at the ceiling wall 1a of the processing vessel 1. The shower head 20 is placed to face the susceptor 10. The shower head 20 discharges the processing gas supplied from the gas supply unit 40 into the processing vessel 1 in a shower shape. Provided at a substantially central position of an upper portion of the shower head 20 is a gas inlet opening 21 through which the gas is introduced. Further, a gas diffusion space 23 is formed within the shower head 20. The shower head 20 is provided with a multiple number of gas discharge holes 25 formed at a bottom surface thereof. The gas discharge holes 25 communicate with the gas diffusion space 23.

<Gas Exhaust Device>

The gas exhaust device 30 is equipped with a vacuum pump (not shown), a pressure control valve (not shown), and so forth to set the inside of the processing vessel 1 to a preset depressurized (vacuum) state. Provided at the bottom wall 1c of the processing vessel 1 is a gas exhaust chamber 31 which is protruded downwards. A gas exhaust line 33 is connected to a side surface of the gas exhaust chamber 31 through a gas exhaust opening 31a, and the gas exhaust line 33 is connected to the gas exhaust device 30. By operating the gas exhaust device 30, the inside of the processing vessel 1 can be decompressed to be in the preset depressurized (vacuum) state. Further, the gas exhaust device 30 is connected to a non-illustrated pressure measurement unit configured to measure an internal pressure of the processing vessel 1. The gas exhaust device 30 is capable of controlling the internal pressure of the processing vessel 1 by adjusting a gas exhaust amount based on the pressure measured by the pressure measurement unit.

<Gas Supply Unit>

The gas supply unit 40 includes a film forming source container 41 which stores therein ruthenium carbonyl (Ru$_3$(CO)$_{12}$) as a film forming source material S in a solid state; a CO gas container 43 which stores therein a CO gas; and a dilution gas container 45 which stores therein a dilution gas. Further, the gas supply unit 40 also includes a film forming gas supply line 47 configured to supply a film forming gas containing a ruthenium carbonyl gas from the film forming source container 41 into the processing vessel 1; a CO gas supply line 49 configured to supply the CO gas from the CO gas container 43 into the film forming source container 41; a bypass line 51 configured connect the film forming gas supply line 47 and the CO gas supply line 49; and a dilution gas supply line 53 configured to supply the dilution gas from the dilution gas container 45 into the processing vessel 1 via the film forming gas supply line 47.

(Film Forming Source Container)

The film forming source container 41 stores therein the ruthenium carbonyl (Ru$_3$(CO)$_{12}$) as the film forming source material S in the solid state. A jacket type heater 41a, for example, is provided around the film forming source container 41 and is configured to heat the ruthenium carbonyl in the solid state to a predetermined temperature.

(CO Gas Container)

The CO gas supply line 49 is connected to the CO gas container 43 which stores the CO gas therein. The CO gas serves as a carrier gas configured to carry the ruthenium carbonyl gas, which is generated from the ruthenium carbonyl in the solid state, into the processing vessel 1.

(Dilution Gas Container)

The dilution gas container 45 stores therein the dilution gas for diluting the film forming gas. The dilution gas may be, by way of example, but not limitation, a rare gas such as an Ar gas or an inert gas such as a N$_2$ gas. Further, the dilution gas may also be used as a purge gas for purging a residual gas within the film forming gas supply line 47 and the processing vessel 1.

(Film Forming Gas Supply Line)

One end of the film forming gas supply line 47 is connected to the film forming source container 41, and the other end thereof is connected to the gas inlet opening 21 of the shower head 20. The film forming gas supply line 47 is provided with a flowmeter 55 configured to measure a flow rate of the ruthenium carbonyl gas; and valves 57a and 57b arranged at an upstream side and a downstream side in a gas flow direction with the flowmeter 55 therebetween. An end portion of the one end of the film forming gas supply line 47 is inserted into the film forming source container 41 from above, and a mixed gas of the ruthenium carbonyl gas generated within the film forming source container 41 and the CO gas is supplied into the processing vessel 1 through the film forming gas supply line 47.

(CO Gas Supply Line)

One end of the CO gas supply line 49 is connected to the CO gas container 43, and the other end thereof is connected to the inside of the film forming source container 41. The CO gas supply line 49 is provided with a mass flow controller 59 for a flow rate control; and valves 61a and 61b arranged at an upstream side and a downstream side in a gas flow direction with the mas flow controller 59 therebetween. An end portion of the other end of the CO gas supply line 49 is inserted into the film forming source container 41 from above, and the CO gas as the carrier gas is introduced into the film forming source container 41 through the CO gas supply line 49. By introducing the CO gas as the carrier gas into the film forming source container 41 from the CO gas container 43 through the CO gas supply line 49, the ruthenium carbonyl can be sublimated within the film forming source container 41, so that the ruthenium carbonyl gas can be generated.

(Bypass Line)

The bypass line 51 connects a portion of the film forming gas supply line 47 and a portion of the CO gas supply line 49. To be specific, one end of the bypass line 51 is connected to a portion between the mass flow controller 59 and the valve 61b at the downstream side of the CO gas supply line 49, and the other end of the bypass line 51 is connected to a portion between the valve 57a at the upstream side and the flowmeter 55 of the film forming gas supply line 47. Further, the bypass line 51 is provided with a valve 63. The CO gas from the CO gas container 43 can be directly supplied into the processing vessel 1 through the film forming gas supply line 47 via the bypass line 51 without passing through the film forming source container 41.

(Dilution Gas Supply Line)

One end of the dilution gas supply line 53 is connected to the dilution gas container 45, and the other end thereof is connected to a portion of the film forming gas supply line 47. The dilution gas can be supplied into the processing vessel 1 through the dilution gas supply line 53 and the film forming gas supply line 47. The dilution gas supply line 53 is provided with a mass flow controller 65 for flow rate control; and valves 67a and 67b arranged at an upstream side and a downstream side in a gas flow direction with the mass flow controller 65 therebetween.

(Film Forming Gas Supply Path)

The film forming gas supply line 47 constitutes a film forming gas supply path through which the mixed gas of the CO gas and the ruthenium carbonyl gas, which is generated by introducing the CO gas as the carrier gas into the film forming source container 41, is introduced into the processing vessel 1. That is, the ruthenium carbonyl is sublimated within the film forming source container 41 to become the ruthenium carbonyl gas by introducing the CO gas as the carrier gas into the film forming source container 41 from the CO gas container 43 through the CO gas supply line 49. Then, the ruthenium carbonyl gas is carried by the CO gas to be introduced into the processing vessel 1 via the film forming gas supply line 47 as the film forming gas supply path and the shower head 20.

(CO Gas Supply Path)

A part of the CO gas supply line 49, the bypass line 51 and a part of the film forming gas supply line 47 constitute a CO gas supply path through which the CO gas is directly introduced into the processing vessel 1 from the CO gas container 43 without passing through the film forming source container 41. Here, the term "a part of the CO gas supply line 49" implies a portion of the CO gas supply line 49 ranging from a connection point with the CO gas container 43 to a connection point with the bypass line 51. Further, the term "a part of the film forming gas supply line 47" implies a portion of the film forming gas supply line 47 ranging from a connection point with the bypass line 51 to a connection point with the gas inlet opening 21 of the shower head 20.

Furthermore, the gas supply unit 40 may further include equipments such as a line, a valve and a mass flow controller for introducing, besides the gases mentioned above, for example, a hydrogen gas or a cleaning gas into the processing vessel 1. In FIG. 1, by way of non-limiting example, a hydrogen gas container 69a configured to store a hydrogen gas therein and a hydrogen gas supply line 69b configured to supply the hydrogen gas into the processing vessel 1 are indicated by an imaginary line.

Moreover, in FIG. 1, the CO gas from the CO gas container 43 is supplied into the processing vessel 1 through the film forming gas supply line 47 via the bypass line 51 without passing through the film forming source container 41. However, the line configuration shown in FIG. 1 is nothing more than an example, and various other configurations for introducing the CO gas into the processing vessel 1 without passing through the film forming source container 41 may be adopted. For example, a CO gas supply source may be provided in addition to the CO gas container 43, and the CO gas may be supplied into the processing vessel 1 from this additional CO gas supply source via a line.

<Controller>

Figure 2:
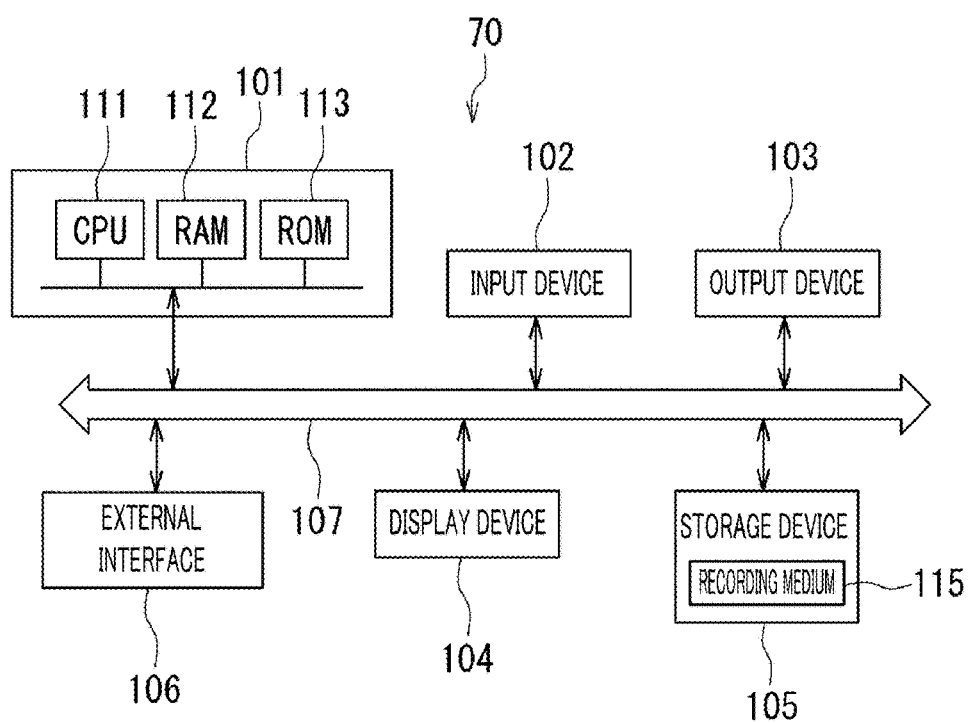
FIG. 2 is a block diagram showing an example of a hardware configuration of a controller of the film forming apparatus shown in FIG. 1.

The individual components of the film forming apparatus 100 is connected to and controlled by the controller 70. The controller 70 is typically a computer. FIG. 2 illustrates an example of a hardware configuration of the controller 70 shown in FIG. 1. The controller 70 includes a main controller 101, an input device 102 such as a keyboard and a mouse, an output device 103 such as a printer, a display device 104, a storage device 105, an external interface 106, and a bus 107 connecting these components. The main controller 101 includes a CPU (Central Processing Unit) 111, a RAM (Random Access Memory) 112 and a ROM (Read Only Memory) 113. The type of the storage device 105 is not particularly limited as long as it is capable of storing therein information. By way of non-limiting example, the storage device 105 may be, but not limited to, a hard disk device, or an optical disk device. Further, the storage device 105 is configured to store information on a computer readable recording medium 115 and read out information from the recording medium 115. The type of the recording medium 115 is not particularly limited as long as it is capable of recording information. By way of non-limiting example, the recording medium 115 may be, but not limited to, a hard disk, an optical disk, a flash memory, or the like. Also, the recording medium 115 may be a medium having recorded thereon a recipe of a film forming method according to the exemplary embodiment.

In the controller 70, the CPU 111 executes a program stored in the ROM 113 or the storage device 105 by using the RAM 112 as a working area, so that a desired process can be performed on the wafer W in the film forming apparatus 100 according to the exemplary embodiment. To elaborate, the controller 70 controls, in the film forming apparatus 100, individual components (the heater power supply 15, the gas exhaust device 30, the gas supply unit 40, and so forth) related to process conditions such as, for example, a temperature of the wafer W, a process pressure, and a gas flow rate. By way of example, in the film forming apparatus 100, the controller 70 is configured to control the gas supply unit 40 such that the processing gases such as the CO gas alone, the mixed gas of the CO gas and the ruthenium carbonyl gas, and the rare gas are supplied into the processing vessel 1 at preset timings, preset flow rates and preset flow rate ratios.

Moreover, the controller 70 may also be configured to control the individual components of the film forming apparatus 100 in response to instructions from an upper-level controller (not shown). In such a case, the upper-level controller may be equipped with a recording medium having stored thereon recipes for performing the film forming method to be described below, and may control the film forming process in the film forming apparatus 100 according to the recipes stored in the recording medium.

<Film Forming Method of Ruthenium Film>

First Exemplary Embodiment

Figure 3:
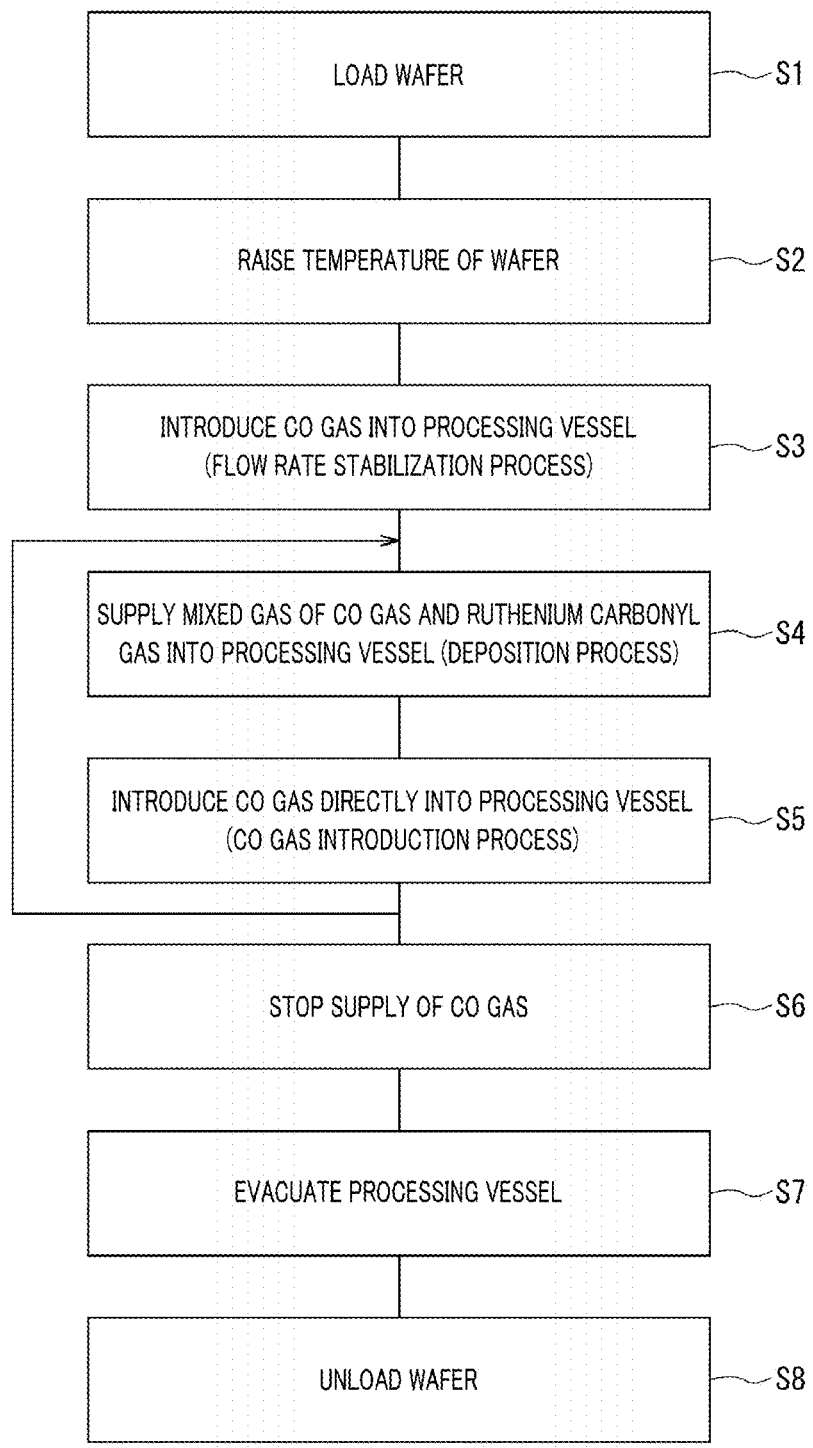
FIG. 3 is a flowchart illustrating an example of a sequence of a ruthenium film forming method according to a first exemplary embodiment.

Now, a film forming method of a ruthenium film, which is performed in the film forming apparatus 100, will be explained with reference to FIG. 3 to FIG. 6. FIG. 3 is a flowchart illustrating an example of a sequence of the ruthenium film forming method according to a first exemplary embodiment. This film forming method includes processes from a process S1 to a process S8, as depicted in FIG. 3.

(Process S1)

First, after the gate valve GV is opened, a wafer W is carried into the processing vessel 1 through the carry-in/out opening 3, and then, is mounted on the susceptor 10.

(Process S2)

The susceptor 10 is previously heated to a temperature in a range from, e.g., 150° C. to 250° C. by the heater 13, and a temperature of the wafer W on the susceptor 10 is raised. Here, by evacuating the processing vessel 1 by the vacuum pump of the gas exhaust device 30, an internal pressure of the processing vessel 1 is set to, e.g., $1.33 \times 10^{-3}$ Pa or less.

(Process S3)

Subsequently, while keeping the valves 61a, 63 and 57b opened and the valves 61b and 57a closed, a CO gas is supplied from the CO gas container 43 into the processing vessel 1 through the CO gas supply line 49, the bypass line 51 and the film forming gas supply line 47. The CO gas is supplied until a flow rate of the CO gas as a carrier gas is stabilized (flow rate stabilization process).

(Process S4)

Once the flow rate of the CO gas is stabilized, the valve 63 is closed and the valves 61b and 57a are opened from the state of the flow rate stabilization process of the process S3. That is, the valves 61a and 61b and the valves 57a and 57b are set to be in the open state, whereas the valve 63 is set to be in the closed state. In this state, the CO gas as the carrier gas can be flown into the film forming source container 41 through the CO gas supply line 49. Within the film forming source container 41, ruthenium carbonyl in the solid state is sublimated by being heated with the heater 41a, so that a ruthenium carbonyl gas is generated. The generated ruthenium carbonyl gas is carried by the CO gas, and the mixed gas of the ruthenium carbonyl gas and the CO gas is introduced into the processing vessel 1 via the film forming gas supply line 47 and the shower head 20. On a surface of the wafer W, the ruthenium carbonyl gas is thermally decomposed through a chemical reaction formula (1), so that metal ruthenium (Ru) is generated and deposited (deposition process).

In the deposition process, the decomposition reaction of the ruthenium carbonyl gas as represented by the chemical reaction formula (1) can be suppressed by using the CO gas as the carrier gas. Thus, it is possible to supply the film forming gas into the processing vessel 1 while maintaining the chemical structure of $Ru_3(CO)_{12}$ as much as possible.

$$Ru_3(CO)_{12} \rightarrow 3Ru + 12CO \quad (1)$$

The flow rate of the CO gas as the carrier gas may be desirably, for example, equal to or less than 200 mL/min (sccm). Further, a rare gas may be added to the mixed gas at a preset ratio.

(Process S5)

Thereafter, from the state of the deposition process of the process S4, the valves 61b and 57a are closed, and the valve 63 is opened. That is, the valves 61a, 63 and 57b are set to be in the open state, whereas the valves 61a and 57a are set to be in the closed state. In this state, the CO gas can be directly introduced from the CO gas container 43 into the processing vessel 1 through the CO gas supply line 49, the bypass line 51 and the film forming gas supply line 47 without passing through the film forming source container 41 (CO gas introduction process).

As stated above, in the CO gas introduction process, the CO gas is introduced into the processing vessel 1 alone, and then, brought into contact with the metal ruthenium deposited on the surface of the wafer W, so that CO molecules can be adsorbed to a surface of the metal ruthenium. It is deemed that adsorption and desorption between $Ru_3(CO)_{12}$ and CO as represented by the following chemical reaction formulas (2) and (3) take place on the surface of the wafer W.

$$Ru_3(CO)_{12}(g) \leftrightarrow Ru_3(CO)_y(ad) + (12-y)CO(ad) \quad (2)$$

$$Ru_3(CO)_y(ad) + (12-y)CO(ad) \leftrightarrow 3Ru(s) + 12CO(g) \quad (3)$$

These reactions are equilibrium reactions. By supplying the CO gas alone, the chemical reaction formula (3), for example, may easily progress to the left (in the direction in which $Ru_3(CO)_y(ad)$ and $(12-y)CO(ad)$ are generated). Accordingly, by allowing a time period during which only the CO gas is supplied after the deposition process, a multiple number of CO molecules are adsorbed to surfaces of nuclei of the metal ruthenium generated in the deposition process. As a result, growth of the individual nuclei of the metal ruthenium is inhibited, so that a large number of small nuclei is generated. It is deemed that the continuous film is formed based on the small nuclei in which the growth thereof is inhibited, so that the continuous film having a small thickness can be formed. Thus, even in a copper wiring forming process for a semiconductor device which is miniaturized more than, for example, 22 nanometer technology node, it is possible to form a very thin ruthenium film, which serves as a underlying film of the copper film, having a thickness equal to or less than 2 nm, desirably, 1 nm to 2 nm and, more desirably, about 1 nm, as a continuous film. By thinning the ruthenium film in this way, a cross section of the copper wiring can be maximized, and a volume of the copper wiring buried in the trench or the hole can also be maximized. Thus, the wiring resistance can be reduced, and the RC delay can be suppressed.

Though the deposition process of the process S4 and the CO gas introduction process of the process S5 may be performed only a single time, it is desirable to repeat these processes until the ruthenium film having a preset thickness is formed. The method of repeating the deposition process of the process S4 and the CO gas introduction process of the process S5 may be referred to as "cycle film formation"). In the cycle film formation, the repetition number of the deposition process of the process S4 and the CO gas introduction process of the process S5 can be previously determined experimentally depending on a target film thickness. For example, the repetition number may be set as a part of the recipe. Further, referring to the flowchart of FIG. 3, when performing the deposition process of the process S4 and the CO gas introduction process of the process S5 repeatedly, the last process S5 (CO gas introduction process) can be omitted.

<Repetition Conditions>

Figure 4:
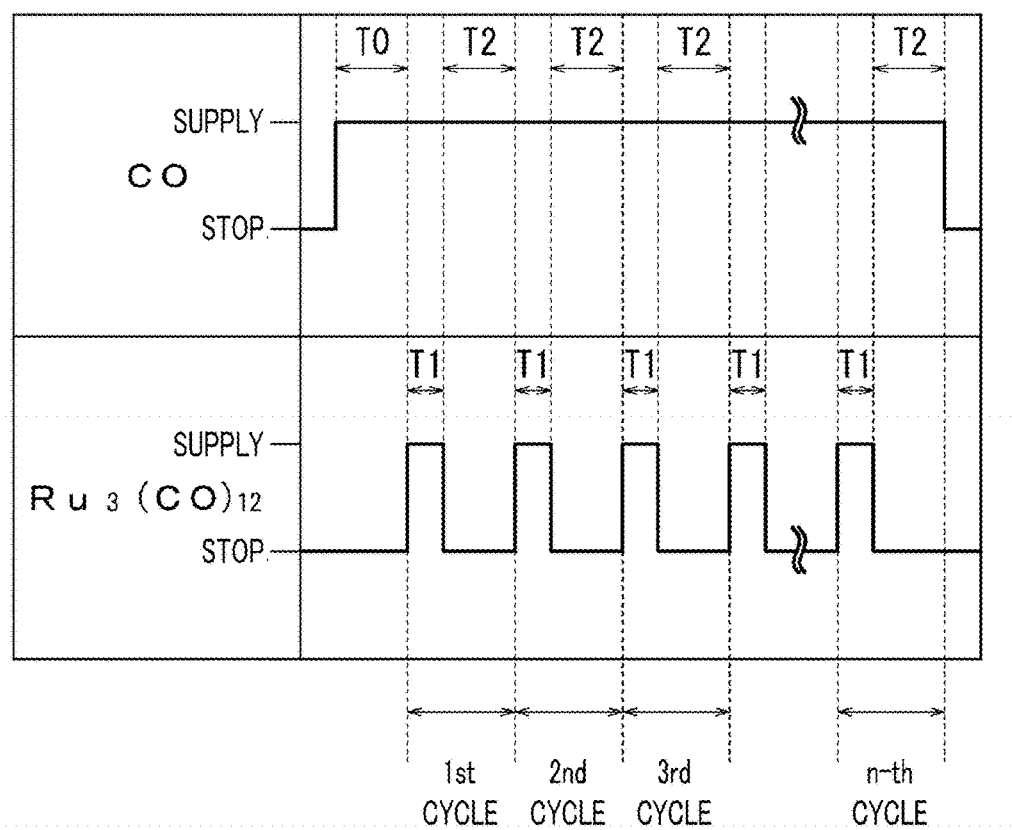
FIG. 4 is an example timing chart illustrating a start and a stop of a supply of a CO gas and a ruthenium carbonyl gas when performing a deposition process and a CO gas introduction process repeatedly.
Figure 5:
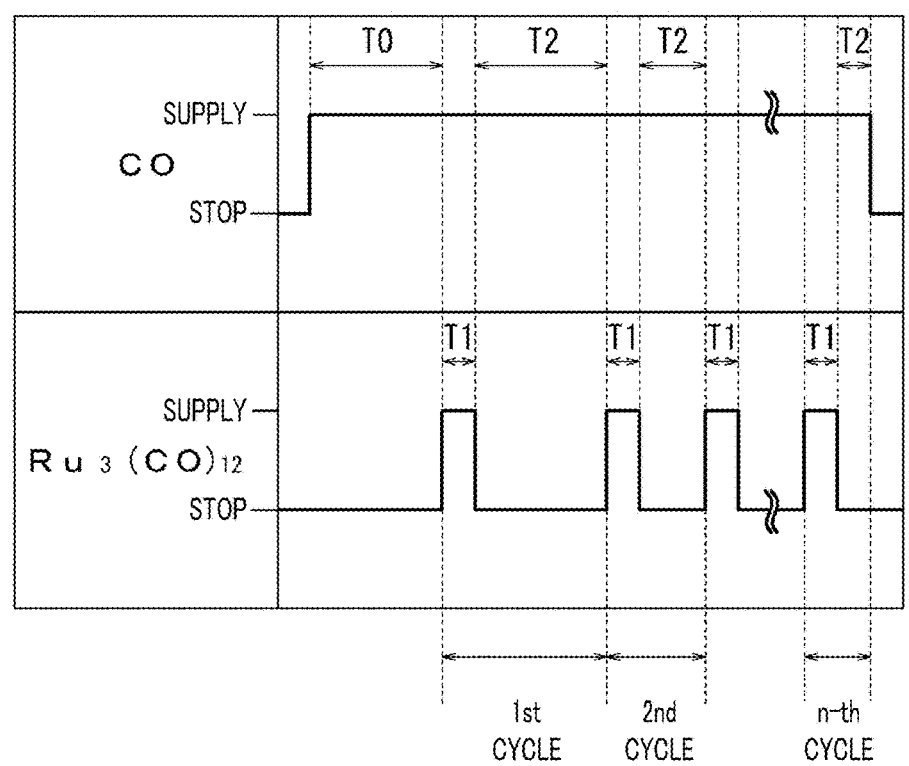
FIG. 5 provides another example timing chart illustrating the start and the stop of the supply of the CO gas and the ruthenium carbonyl gas when performing the deposition process and the CO gas introduction process repeatedly.
Figure 6:
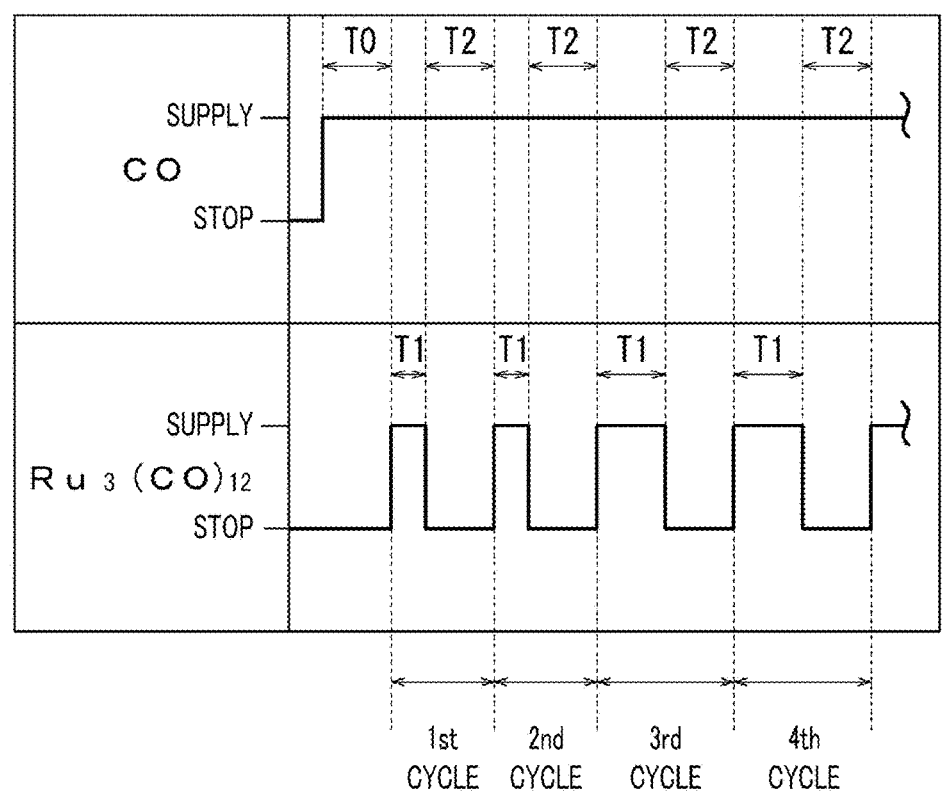
FIG. 6 is a still another example timing chart illustrating the start and the stop of the supply of the CO gas and the ruthenium carbonyl gas when performing the deposition process and the CO gas introduction process repeatedly.

FIG. 4 to FIG. 6 present timing charts illustrating timings for supply and stop of the supply of the CO gas and the ruthenium carbonyl gas in the cycle film formation. In FIG. 4 to FIG. 6, T0 represents a time period for the flow rate stabilization process (process S3 of FIG. 3) in which only the CO gas is first introduced into the processing vessel 1. Further, T1 denotes a time period for the deposition process (process S4 of FIG. 3) in which both the CO gas and the ruthenium carbonyl gas are introduced into the processing vessel 1. Further, T2 represents a time period for the CO gas introduction process (process S5 of FIG. 3) for suppressing the growth of the metal ruthenium. T1 and T2 may be repeated a preset number of times, for example, several cycles to several tens of cycles. In FIG. 4 and FIG. 5, when setting T1 and T2 as a single cycle, the single cycle is repeated n times. In FIG. 6, when setting T1 and T2 as a single cycle, the single cycle is repeated four times.

FIG. 4 illustrates an example of the cycle film formation where the time periods T1 and T2 are set to be constant during the whole period from the first cycle to the $n^{th}$ cycle. As shown in FIG. 4, it is desirable that the time period T2 for the single CO gas introduction process is longer than the time period T1 for the single deposition process. By setting T1 to be shorter than T2 (T1<T2), the chemical reaction formula (3) is allowed to progress to the left (i.e., in the direction in which $Ru_3(CO)_y(ad)$ and $(12-y)CO(ad)$ are generated), so that a sufficient amount of CO molecules can be adsorbed to the surfaces of the nuclei of the metal ruthenium generated in the deposition process. In this case, it is desirable to set up the condition of T1<T2 within the T1 range from, e.g., 1 sec to 10 sec and the T2 range from, e.g., 5 sec to 20 sec. Further, it is more desirable to set up the condition of T1<T2 within the T1 range from, e.g., 2 sec to 7 sec and the T2 range from, e.g., 5 sec to 15 sec.

FIG. 5 shows an example where the time period T1 is maintained constant whereas the time period T2 is gradually decreased while the first cycle to the $n^{th}$ cycle are repeated. As stated above, in order to form the thin continuous film by the CVD method, it is important to suppress the growth of the individual metal ruthenium nuclei by adsorbing the sufficient amount of the CO molecules onto the surfaces of the nuclei of the metal ruthenium generated in the deposition process. For this purpose, at the initial stage of the cycle film formation from the first cycle to the $n^{th}$ cycle, it may be effective to set the time period T2 for the CO gas introduction process to be long enough to suppress the growth of the nuclei of the metal ruthenium film. Meanwhile, at the later stage of the cycle film formation, it is effective in reducing the total processing time for the film formation to set the time period T2 for the CO gas introduction process to be short and a ratio of the time period T1 for the deposition process to be relatively large. As depicted in FIG. 5, by gradually decreasing the time period T2, it is possible to form the thin continuous film while shortening the processing time for the film formation. Furthermore, in this case, the condition of T1<T2 may not be necessarily satisfied at the later stage of the cycle film formation. In addition, though the time period T2 is reduced every single cycle in FIG. 5, the time period T2 may also be reduced stage by stage every plural cycles.

FIG. 6 illustrates an example where the time period T2 is maintained constant whereas the time period T1 is gradually increased stage by stage while the first cycle to the $n^{th}$ cycle are repeated. In this case, at the initial stage of the cycle film formation from the first cycle to the $n^{th}$ cycle, the growth of the nuclei can be suppressed by setting the ratio of the T2 for the CO gas introduction process to be relatively large. Meanwhile, at the later stage of the cycle film formation, by setting the ratio of the T1 for the deposition process to be relatively large, it is possible to form the thin continuous film while shortening the processing time for the film formation, in the same manner as in the example of FIG. 5. In this case as well, the condition of T1<T2 may not be necessarily satisfied at the later stage of the cycle film formation. In addition, though the time period T1 is increased every two cycles in FIG. 6, the time period T1 may also be increased gradually every single cycle.

As staged above, when performing the deposition process and the CO gas introduction process repeatedly, in order to control the thickness of the ruthenium film with high precision, it is desirable to maintain the internal pressure of the processing vessel 1 constant. For this purpose, it is desirable to set the flow rates of the CO gas and the ruthenium carbonyl gas to be constant, and to just switch the supply and the stop of the supply of these gases.

(Process S6)

Upon forming the ruthenium film having the preset thickness, by closing the valves 61a, 61b and 57a, the supply of the CO gas is stopped, and the supply of the ruthenium carbonyl gas is also stopped. When necessary, the valves 67a and 67b may be opened, and the dilution gas from the dilution gas container 45 may be introduced into the processing vessel 1 as a purge gas to purge the ruthenium carbonyl gas therein.

(Process S7)

Subsequently, the inside of the processing vessel 1 is evacuated by operating the gas exhaust device 30.

(Process S8)

Thereafter, the gate valve GV is opened, and the wafer W is carried out through the carry-in/out opening 3.

Through the above-described sequence, the ruthenium film formation on the single sheet of wafer W is finished.

In the cycle film formation, though the repetition number of the deposition process of the process S4 and the CO introduction process of the process S5 may be previously set as the recipe, it is also possible to determine the repetition number based on the thickness of the ruthenium film to be formed. For example, the thickness of the ruthenium film may be monitored by an optical detector such as, but not limited to, an ellipsometer, and the repetition of the deposition process of the process S4 and the CO gas introduction process of the process S5 may be ended if the thickness of the ruthenium film reaches a preset film thickness.

As stated above, in the film forming method of the ruthenium film according to the present exemplary embodiment, by bringing the CO gas into contact with the metal ruthenium film formed on the wafer W by the CVD method (desirably, with the nuclei of the metal ruthenium at the initial stage of the deposition thereof), the growth of the nuclei can be suppressed effectively. As a result, the continuous film is formed based on the small nuclei in which the growth thereof is suppressed. Thus, the very thin continuous ruthenium film having a thickness equal to or less than, e.g., 2 nm can be formed. Further, since the CO gas, which serves as the carrier gas, can be used as a material for suppressing the growth of the nuclei, additional equipment for supplying materials need not be provided, and this gas can be supplied just by switching the valves of the gas supply unit 40. Furthermore, since the CO gas which serves as the carrier gas can be used, the probability of generation of the by-product or introduction of impurities into the ruthenium film is not increased.

Second Exemplary Embodiment

Figure 7:
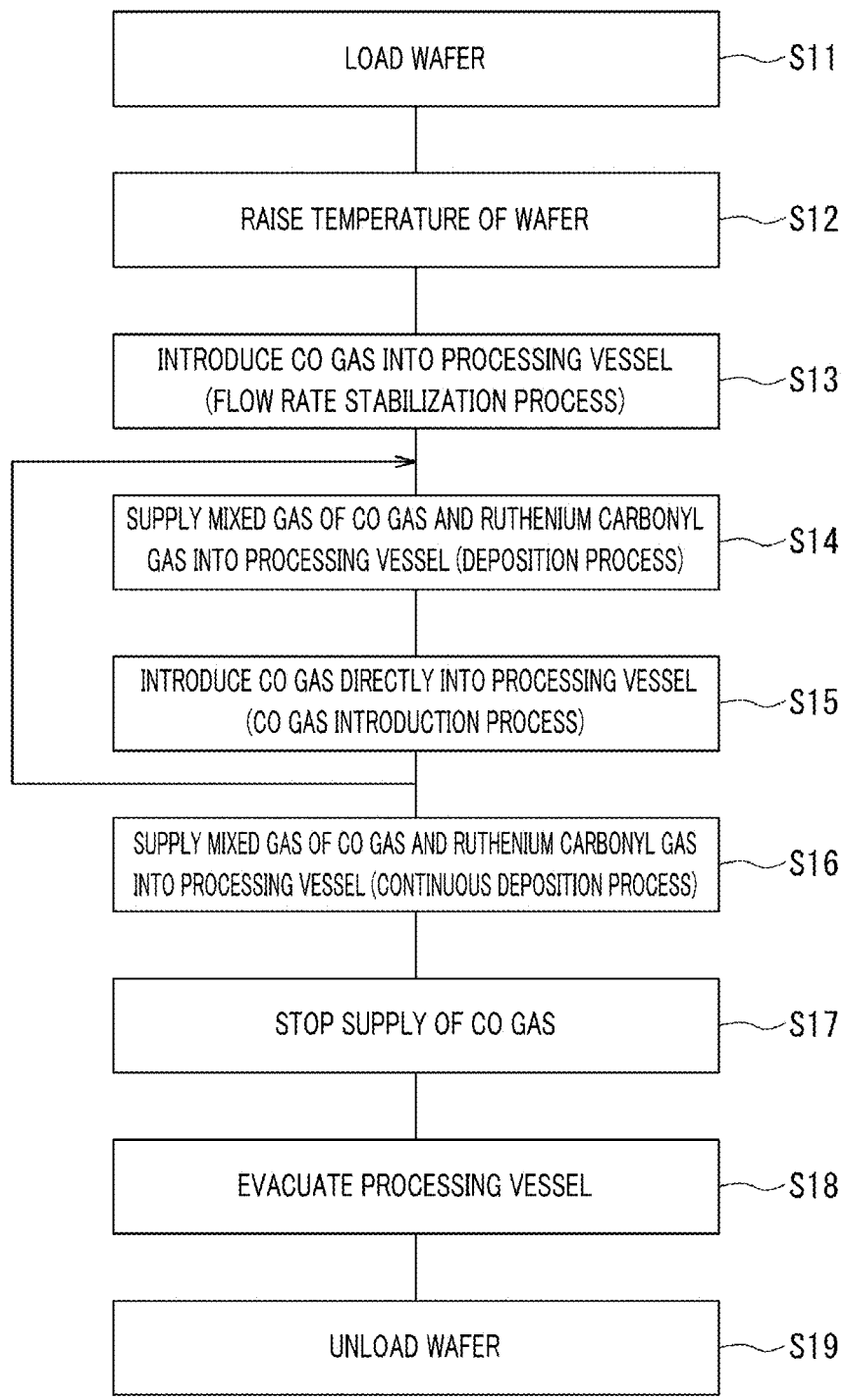
FIG. 7 is a flowchart illustrating an example of a sequence of a ruthenium film forming method according to a second exemplary embodiment.

FIG. 7 is a flowchart illustrating an example of a sequence of the film forming method of the ruthenium film according to a second exemplary embodiment. This film forming method includes processes from a process S11 to a process S19, as depicted in FIG. 7. In FIG. 7, the processes S11 to S15 and the processes S17 to S19 are the same as the processes S1 to S5 and the processes S6 to S8 in the first exemplary embodiment (see, FIG. 3), respectively, and, thus, description thereof is omitted. That is, the sequence shown in FIG. 7 is different from the sequence of the first exemplary embodiment (see, FIG. 3) in that a continuous deposition process of the process S16 is performed after the deposition process of the process S14 and the CO gas introduction process of the process S15 are repeated as many times as required.

(Process S16)

The process S16 is a continuous deposition process in which the ruthenium film is continuously deposited, as in the conventional ruthenium film forming process by the CVD method. Basically, the process S16 can be performed in the same way as the deposition process of the process S14. That is, in the process S16, the valves 61a and 61b and the valves 57a and 57b are opened, and the valve 63 is closed in the film forming apparatus 100. In this state, the CO gas as the carrier gas is flown into the film forming source container 41 through the CO gas supply line 49. Within the film forming source container 41, the ruthenium carbonyl gas is generated, and the mixed gas of the CO gas and the generated ruthenium carbonyl gas is introduced into the processing vessel 1 via the film forming gas supply line 47 and the shower head 20. Then, on the surface of the wafer W, the ruthenium carbonyl gas is thermally decomposed, so that the metal ruthenium (Ru) is generated and deposited. As a result, the ruthenium film having a predetermined thickness is formed (continuous deposition process).

As stated above, after the deposition process of the process S14 and the CO gas introduction process of the process S15, by performing the continuous deposition process of the process S16 in which the ruthenium film is continuously formed, throughput of the film forming process can be improved. As described above, in order to form the thin continuous film by the CVD method, it is important to suppress the growth of individual metal ruthenium nuclei at an early stage of the deposition by adsorbing a sufficient amount of the CO molecules onto surfaces of the nuclei of the generated metal ruthenium. If fine ruthenium nuclei are formed at the early stage of the deposition and their growth is suppressed, it is not necessarily required to introduce the CO gas alone at a later stage of the deposition. It is deemed that the throughput can be further improved by performing the deposition process continuously, rather than performing the CO gas introduction process, until a desired film thickness is obtained.

Other configurations and effects of the present exemplary embodiment are the same as those of the first exemplary embodiment.

Third Exemplary Embodiment

Figure 8:
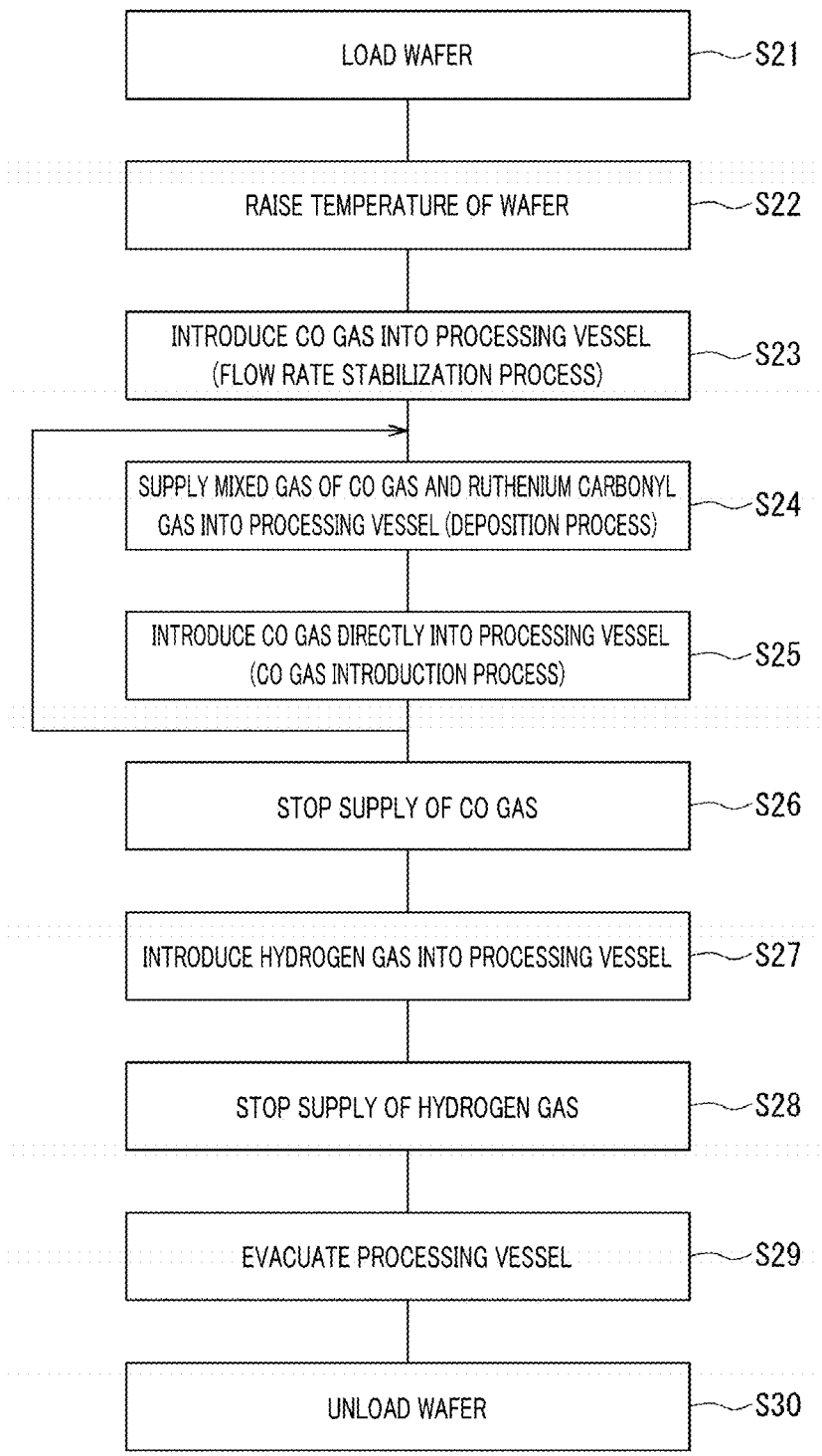
FIG. 8 is a flowchart illustrating an example of a sequence of a ruthenium film forming method according to a third exemplary embodiment.

FIG. 8 is a flowchart illustrating an example of a sequence of the film forming method of the ruthenium film according to a third exemplary embodiment. This film forming method includes processes from a process S21 to a process S30, as depicted in FIG. 8. In FIG. 8, the processes S21 to S26 and the processes S29 and S30 are the same as the processes S1 to S6 and the processes S7 and S8 in the first exemplary embodiment (see, FIG. 3), respectively, and, thus, description thereof is omitted. That is, the sequence shown in FIG. 8 is different from the sequence of the first exemplary embodiment (see, FIG. 3) in that a hydrogen gas introduction process of the process S27 is performed after the deposition process of the process S24 and the CO gas introduction process of the process S25 are repeated as many times as required.

(Process S27)

The process S27 is a hydrogen gas introduction process in which a hydrogen gas acts on the deposited ruthenium film. By exposing the ruthenium film formed on the wafer W to the hydrogen gas, carbon atoms and oxygen atoms in the ruthenium film and CO molecules adsorbed onto the surface of the ruthenium film are separated from the ruthenium film. Thus, the purity of the metal ruthenium can be improved. Particularly, the carbon atoms are separated from the ruthenium film by the action of the hydrogen, segregation of the carbon atoms on the surface of and in the film may not occur, so that the surface of the ruthenium film can be in a clean state. Accordingly, when burying a copper film later, wettability of copper is improved, so that the copper can be buried without a void.

In the process S27, while keeping the valves 61a and 61b, the valves 57a and 57b, and the valve 63 closed, a hydrogen gas is introduced into the processing vessel 1 from a hydrogen gas container 69a through a hydrogen gas supply line 69b (both are indicated by an imaginary line in FIG. 1). While maintaining a temperature of the wafer W in a range from, e.g., 150° C. to 250° C., the hydrogen gas and the Ar gas as the dilution gas are introduced into the processing vessel 1 at a flow rate ranging from, e.g., 10 mL/min (sccm) to 5000 mL/min (sccm) and at a flow rate ranging from, e.g., 0 mL/min (sccm) to 1000 mL/min (sccm), respectively. It is desirable to perform an annealing process on the ruthenium film under the hydrogen gas atmosphere by setting a hydrogen partial pressure to be in a range from 4 Pa to 1333 Pa.

(Process S28)

After the hydrogen gas introduction process of the process S27 is performed, in the process S28, the supply of the hydrogen gas is stopped by closing a valve (not shown) of the hydrogen gas supply line 69b.

Other configurations and effects of the present exemplary embodiments are the same as those of the first exemplary embodiment.

<Experiment Examples>

Now, experiments results for investigating the effect of the exemplary embodiments will be discussed. First, a TaN film having a thickness of 4 nm is formed on a silicon wafer by an iPVD (Ionized Physical Vapor Deposition) method. Then, by using the film forming apparatus 100 having the same configuration shown in FIG. 1, a ruthenium film is formed on the TaN film by the CVD method according to the sequence of the process S1 to the process S8 of FIG. 3 with ruthenium carbonyl as the source material. Film forming conditions are described as follows.

<Common Conditions>
Carrier gas (CO gas) flow rate: 200 mL/min (sccm)
Internal pressure of processing vessel: 13.3 Pa
Heating temperature for silicon wafer: 195° C.

<Condition 1>
Process S3 (flow rate stabilization process): 10 seconds
Process S4 (deposition process): 5 seconds
Process S5 (CO gas introduction process): 10 seconds
Here, the process S4 and the process S5 are repeated one to eight times.

<Condition 2>
Process S3 (flow rate stabilization process): 10 seconds
Process S4 (deposition process): 2 seconds
Process S5 (CO gas introduction process): 10 seconds
Here, the process S4 and the process S5 are repeated to two to thirty times.

<Condition 3 (Comparative Example)>
After performing the process S3 (flow rate stabilization process), a continuous film formation is conducted by the process S4 (deposition process) until a target film thickness is obtained.

Figure 9:
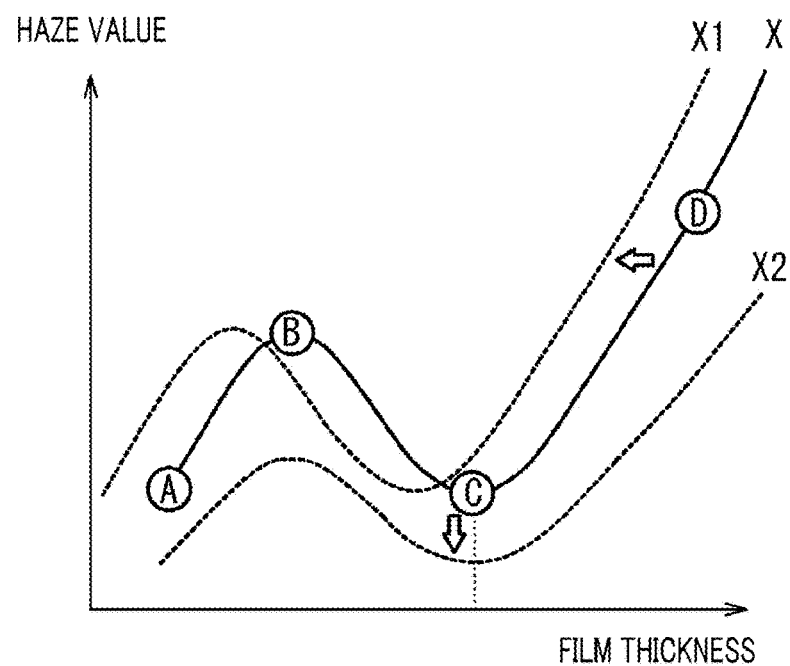
FIG. 9 is an explanatory diagram schematically showing a relationship between a Haze value and a ruthenium film forming process by a CVD method.

Haze values are measured for respective ruthenium films obtained by film forming processes conducted under the above-specified conditions 1 to 3. Here, the Haze value is valid as an index indicating a film surface roughness, and by investigating a behavior of the Haze value for the film thickness, the continuity of the film can be evaluated. Here, a relationship between the Haze value and the ruthenium film forming process by the CVD method can be explained as follows, for example. FIG. 9 schematically depicts a relationship between the Haze value and the ruthenium film forming process by the CVD method. On a curve X shown in FIG. 9, a vertical axis represents the Haze value, and a horizontal axis represents the ruthenium film thickness. A point A in FIG. 9 indicates a stage of nucleus growth; a point B, a stage where regions in which the nucleus is grown come into contact with each other; a point C, a stage where gaps between the regions are filled; and a point D, a stage where the film grows in a vertical direction. The surface roughness of the film is the maximum at the point B, and the surface roughness at the point C is smaller than that at the point B. Further, the surface roughness increases again at the point D along with grain growth. If the curve X is moved in the direction toward the vertical axis in overall, like a curve X1 shown as dotted line, it implies that the continuity of the film is improved. Further, if the curve X is moved in the direction toward the horizontal axis in overall, like a curve X2 shown as dotted line, it implies that the surface roughness of the film decreases and the thickness of the film is uniformed.

Figure 10:
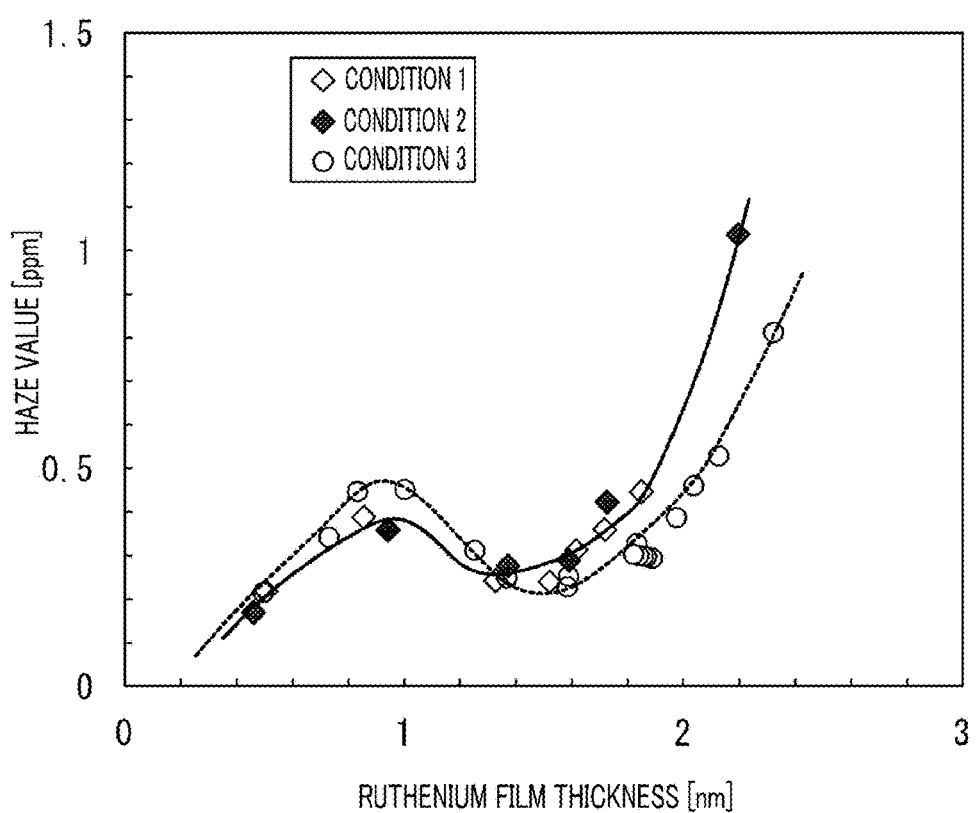
FIG. 10 is graph showing measurement results of Haze values for ruthenium films obtained by film forming processes in an experimental example and a comparative example, respectively.

FIG. 10 is a graph showing measurement results of the Haze values for the ruthenium films obtained by the film forming processes of conditions 1 to 3, respectively. As compared to the condition 3 under which the continuous film formation is performed, in the conditions 1 and 2 where the cycle film formation is performed by repeating the deposition process of the process S4 and the CO gas introduction process of the process S5, curves connecting plots are found to be moved in the direction toward the vertical axis, which indicates that the continuity of each thin film is improved. Further, curves connecting the plots are shown to be moved in the direction toward the horizontal axis in the vicinity of a ruthenium film thickness of 1 nm, which indicates that the surface roughness of the films is reduced and the thicknesses thereof are uniformed. As can be seen from these results, it is found out that a smooth thin ruthenium film having high continuity in a thickness range equal to or less than, e.g., 2 nm, desirably, ranging from 1 nm to 2 nm, can be formed by the cycle film formation.

Now, a test of filling the trench will be explained. By performing the iPVD method, a TaN film having a thickness of 4 nm is formed as a barrier film within a trench. Here, the trench has a width of 50 nm and a depth of 200 nm, and is previously formed in a $SiO_2$ film (TEOS film) on a silicon wafer. Then, the cycle film formation is conducted under the above-specified condition 2, and the ruthenium film having thickness of 1 nm is formed as the liner film. Subsequently, a CuMn film having a thickness of 50 nm is formed by the iPVD method to fill the trench. A scanning electron microscope (SEM) image showing the result is provided in FIG. 11.

Figure 12:
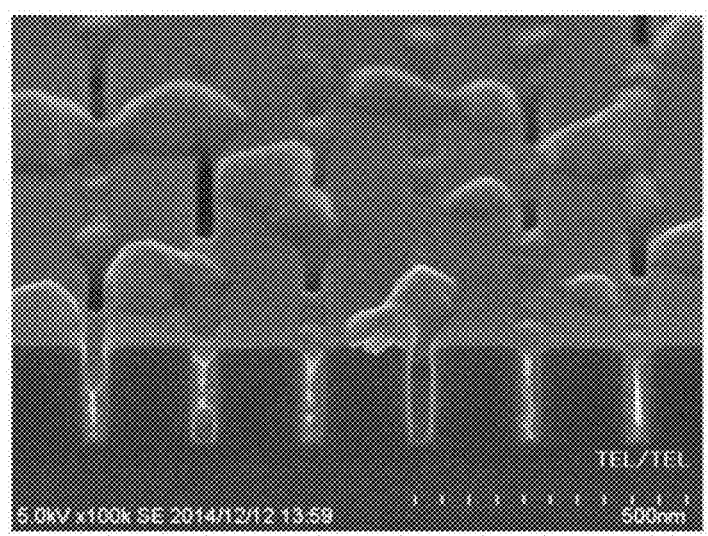
FIG. 12 is a scanning electron microscope image of a trench in which a CuMn film is buried after a ruthenium film is formed by the film forming process in the comparative example.

Further, for comparison, FIG. 12 presents a SEM image showing a result of filling the trench under the same condition excepting that the continuous film formation of the ruthenium film is conducted under the above-specified condition 3 instead of the cycle film formation.

Figure 11:
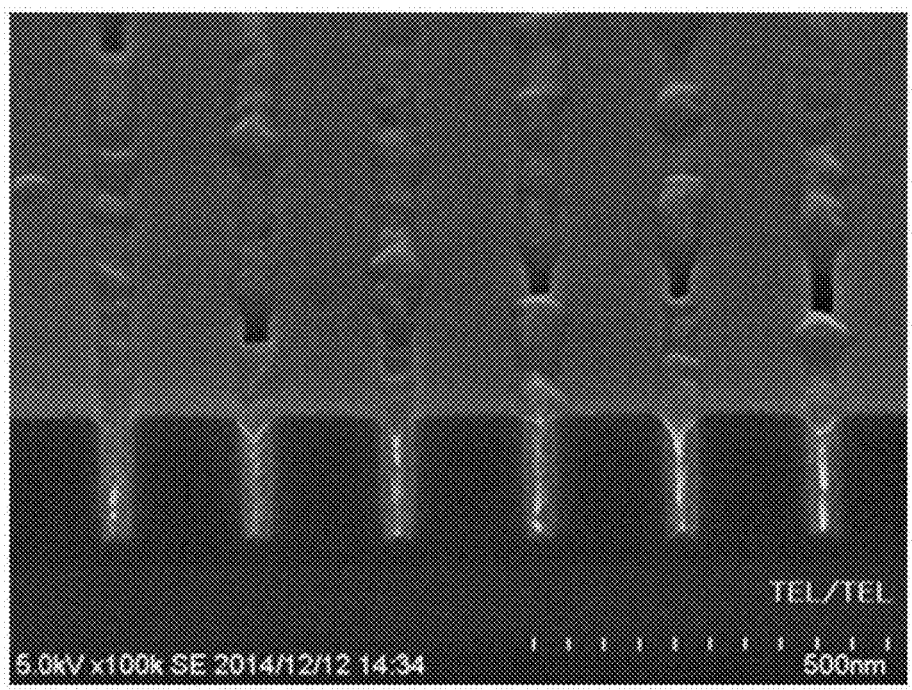
FIG. 11 is a scanning electron microscope image of a trench in which a CuMn film is buried after a ruthenium film is formed by the film forming process in the experimental example.

Referring to FIG. 11 and FIG. 12, the CuMn film is found to be well buried within the trench in FIG. 11, and the burying failure such as a void is not observed. In contrast, in FIG. 12, a void is observed within the trench, which indicates there is a burying failure of the CuMn film. The reason for these results is deemed to be as follows. In the cycle film formation under the condition 2, since a very thin ruthenium film of 1 nm can be formed as a smooth continuous film, the wettability of CuMn is improved when burying the CuMn film, so that the CuMn film can be buried in the trench without any failure. On the contrary, in the continuous film formation under the condition 3, a very thin ruthenium film of 1 nm cannot be formed as a smooth continuous film, so that the wettability of CuMn is poor when burying the CuMn film and the failure in filling the trench occurs.

[Application Example to Wiring Forming Process]

Now, an example where the film forming methods according to the above-described first to third exemplary embodiments are applied to a wiring forming process will be explained. FIG. 13 to FIG. 18 are cross sectional views illustrating a surface of a wafer W in which major dual damascene processes are shown.

Figure 13:
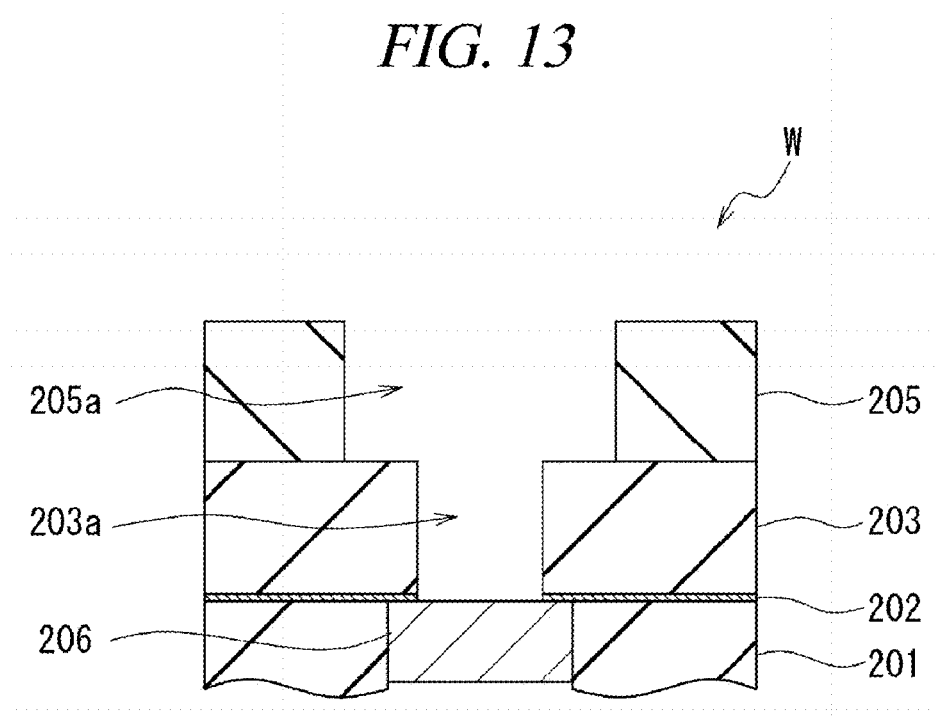
FIG. 13 is a longitudinal cross sectional view of a surface of a semiconductor wafer for illustrating major processes of a dual damascene process.

First, FIG. 13 is a cross sectional view illustrating a major portion of a wafer W, which shows a laminated body before forming the ruthenium film. On the wafer W, an etching stopper film 202, an interlayer insulating film 203 on which a via is to be formed, an interlayer insulating film 205 on which a wiring layer is to be formed are formed in this sequence on an underlying insulating film 201 provided with a lower wiring. Further, the underlying insulating film 201 is provided with the lower wiring 206 in which copper is buried. As for the wafer W, it is desirable to remove residues after the etching/ashing or moisture on surfaces of the insulating films by a degas process or a pre-clean process. The interlayer insulating film 203 and the interlayer insulating film 205 are, for example, a $SiO_2$ film formed by the CVD method, or a Low-k film (SiCO, SiCOH, etc.). The etching stopper film 202 is, by way of non-limiting example, a SiC film, a SIN film or a SiCN film formed by the CVD method. Further, the etching stopper film 202 serves as a barrier configured to suppress diffusion of copper.

As depicted in FIG. 13, the interlayer insulating films 203 and 205 are provided with openings 203a and 205a, respectively, which are formed in preset patterns. These openings 203a and 205a, as is typical, can be formed by etching the interlayer insulating films 203 and 205 in the preset patterns, respectively, through photolithography. The opening 203a is a via hole, and the opening 205a is a wiring groove (trench).

Figure 14:
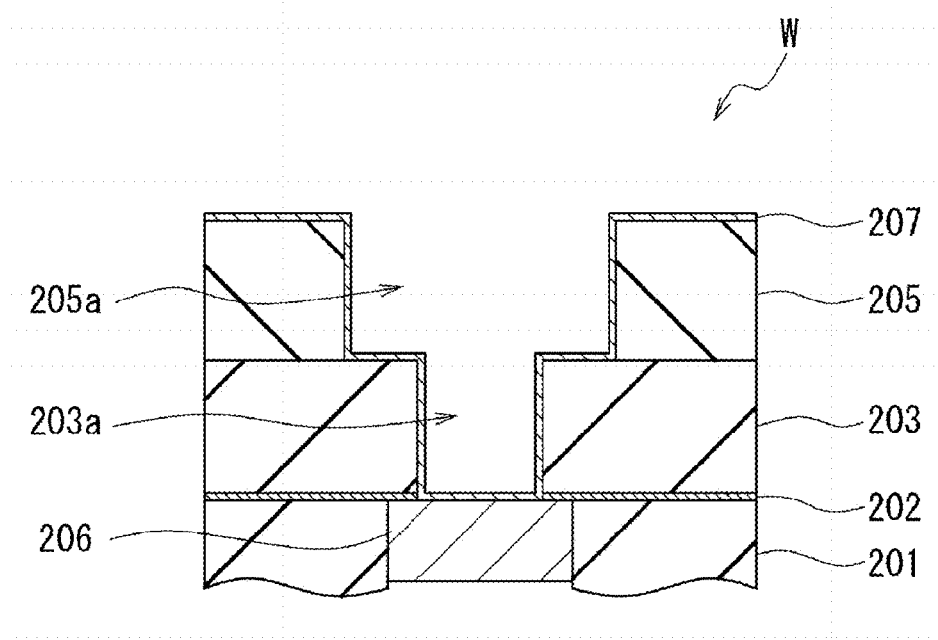
FIG. 14 is a longitudinal cross sectional view of the surface of the semiconductor wafer for illustrating a process subsequent to FIG. 13.

FIG. 14 depicts a state after a barrier film 207 configured to suppress diffusion of copper is formed on the entire surface of the laminated body of FIG. 13 including wall surfaces of the openings 203a and 203b. It is desirable that the barrier film 207 has high barrier property against copper and low resistance. By way of example, a Ti film, a TiN film, a Ta film, a TaN film, a TaCN film, a W film, a WN film, a WCN film, a Zr film, a ZrN film, a V film, a VN film, a Nb film, a NbN film or a double-layer film of Ta/TaN may be used as the barrier film 207. Since the copper wiring has lower resistance as the volume of the copper buried in the trench or the hole increases, it is desirable to form the barrier film to be as thin as possible. From this point of view, it is desirable that the barrier film has a thickness ranging from 1 nm to 20 nm, more desirably, 1 nm to 10 nm. The barrier film can be formed by, for example, the iPVD method such as plasma sputtering. Further, the barrier film may also be formed by another PVD method such as typical sputtering or ion plating, or even by the CVD or the ALD (Atomic Layer Deposition) method or the CVD or the ALD method with plasma.

Figure 15:
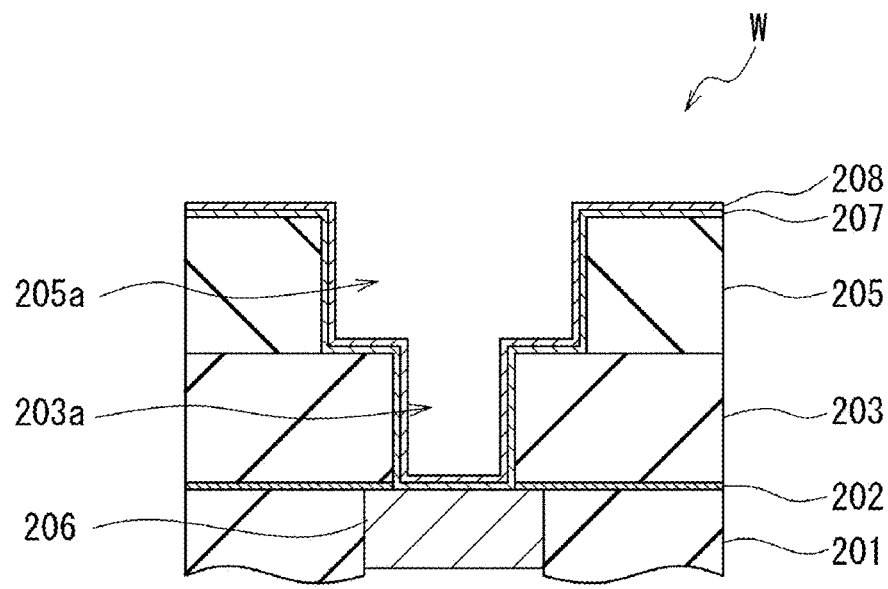
FIG. 15 is a longitudinal cross sectional view of the surface of the semiconductor wafer for illustrating a process subsequent to FIG. 14.

FIG. 15 illustrates a state where the ruthenium film as the liner film 208 is formed on the laminated body of FIG. 14 by the film forming apparatus 100 while using the ruthenium carbonyl ($Ru_3(CO)_{12}$) as the source material according to the film forming method of any one of the above-described first to third exemplary embodiments. By performing the CVD method according to the film forming method of any one of the first to third exemplary embodiments, the linear film 208 having high adhesivity to the barrier film 207 can be formed as a continuous film having a uniform thickness with a high step coverage, even if the openings 203a and 205a have high aspect ratio. Ruthenium has high wettability for copper. Thus, by forming the ruthenium film as a base of the copper, copper can be securely moved when forming the copper film by the PVD method later. Accordingly, overhang causing clogging of the trench or the hole can be suppressed, so that copper can be buried even in a highly miniaturized trench or hole without generating the void.

It is desirable to form the thin liner film 208 having a thickness range equal to or less than 2 nm, desirably, 1 nm to 2 nm, in order to allow the wiring to have low resistance by increasing the volume of the copper to be buried in a subsequent process. In the ruthenium film forming methods according to the above-described first to third exemplary embodiments, it is possible to form a very thin ruthenium film as a continuous film with a high step coverage even in a very minute trench or hole.

Figure 16:
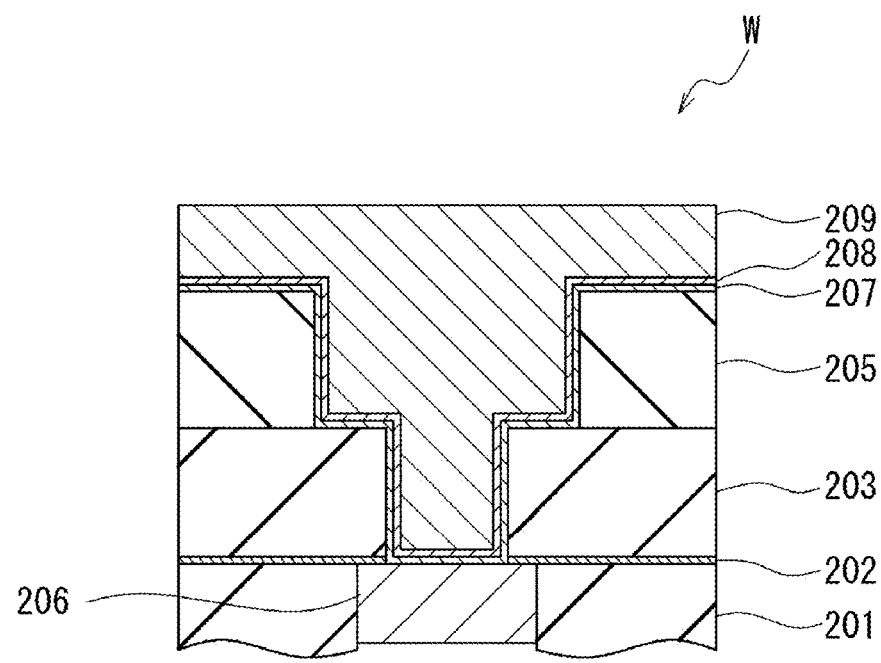
FIG. 16 is a longitudinal cross sectional view of the surface of the semiconductor wafer for illustrating a process subsequent to FIG. 15.

Thereafter, as depicted in FIG. 16, a copper film 209 is formed by the PVD method, and the openings 203a and 205a are buried. The copper film 209 buried within the opening 203a serves a copper plug, and the copper film 209 buried within the opening 205a serves a copper wiring. By using the PVD method, the copper film having higher purity can be formed, as compared to one formed by plating. It is desirable to use the iPVD method as the PVD method. As a result, the overhang of the copper can be suppressed and better buriability of the copper can be obtained. Furthermore, in forming the copper film 209, it is desirable to fill the opening 205a with the copper film 209 completely and deposit the copper film on top thereof in a preset thickness, in preparation for a subsequent planarization process. Here, the portion of the copper film deposited on the top of the opening 205a may not be formed by the PVD method continually, but may be formed by, for example, the plating method.

Figure 17:
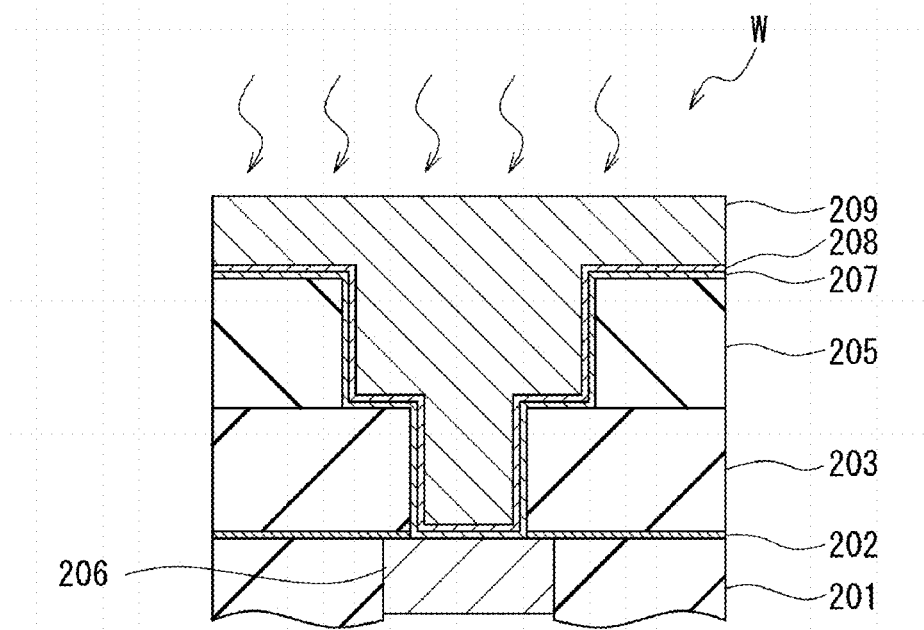
FIG. 17 is a longitudinal cross sectional view of the surface of the semiconductor wafer for illustrating a process subsequent to FIG. 16.
Figure 18:
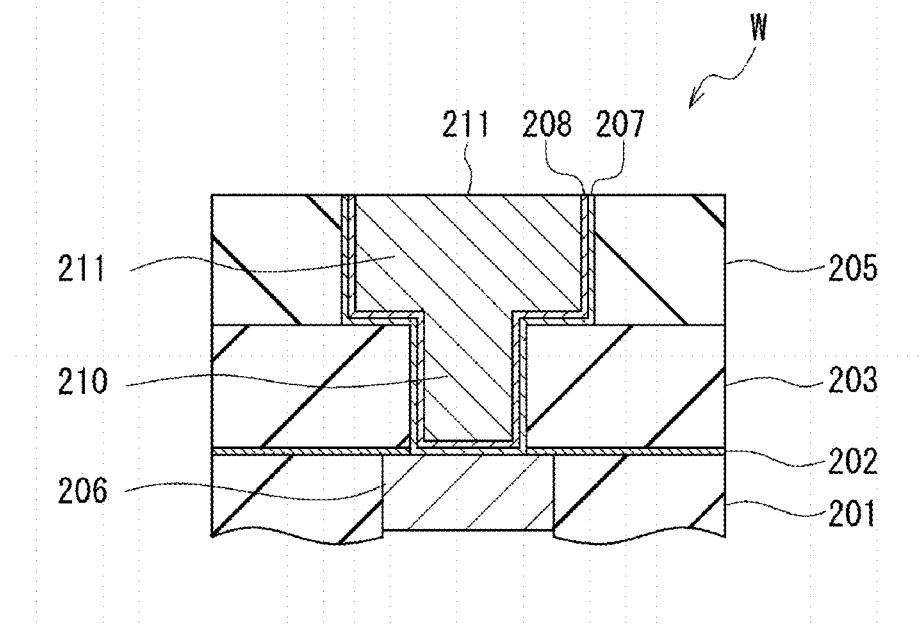
FIG. 18 is a longitudinal cross sectional view of the surface of the semiconductor wafer for illustrating a process subsequent to FIG. 17.

After the copper film 209 is formed, an annealing process is performed when necessary, as depicted in FIG. 17. By the annealing process, the copper film 209 is stabilized.

Thereafter, as is typical, the entire surface of the wafer W is polished by the CMP (Chemical Mechanical Polishing), so that the copper film 209 on the surface of the wafer W and the liner film 208 and the barrier film 207 underneath it are removed, and the copper film 209 is planarized. As a result, the copper plug 210 and the copper wiring 211 are formed. Thereafter, a cap film such as a dielectric cap or a metal cap is formed on the entire surface of the wafer W to cover the copper wiring 211 and the interlayer insulating film 205.

In the film forming methods of the ruthenium film according to the first to third exemplary embodiments, it is possible to form a very thin ruthenium film having a thickness of, e.g., 2 nm or less as a continuous film within a very fine trench or hole with a high step coverage. Thus, by applying these film forming methods to the above-described wiring forming process, the copper film can be buried without generating the void. Furthermore, as the ruthenium film serving as the liner film 208 is thinned, the volume of the copper in the copper plug 210 and the copper wiring 211 can be further increased, so that the copper wiring can have lower resistance. Therefore, even if the wiring structure is miniaturized, the RC delay is suppressed, an electronic component such as a semiconductor device equipped with a highly reliable wiring structure can be manufactured.

In the above, although the film forming processes are described to be applied to the dual damascene process, for example, they can also be applied to a single damascene process.

<Film Forming System>

Figure 19:
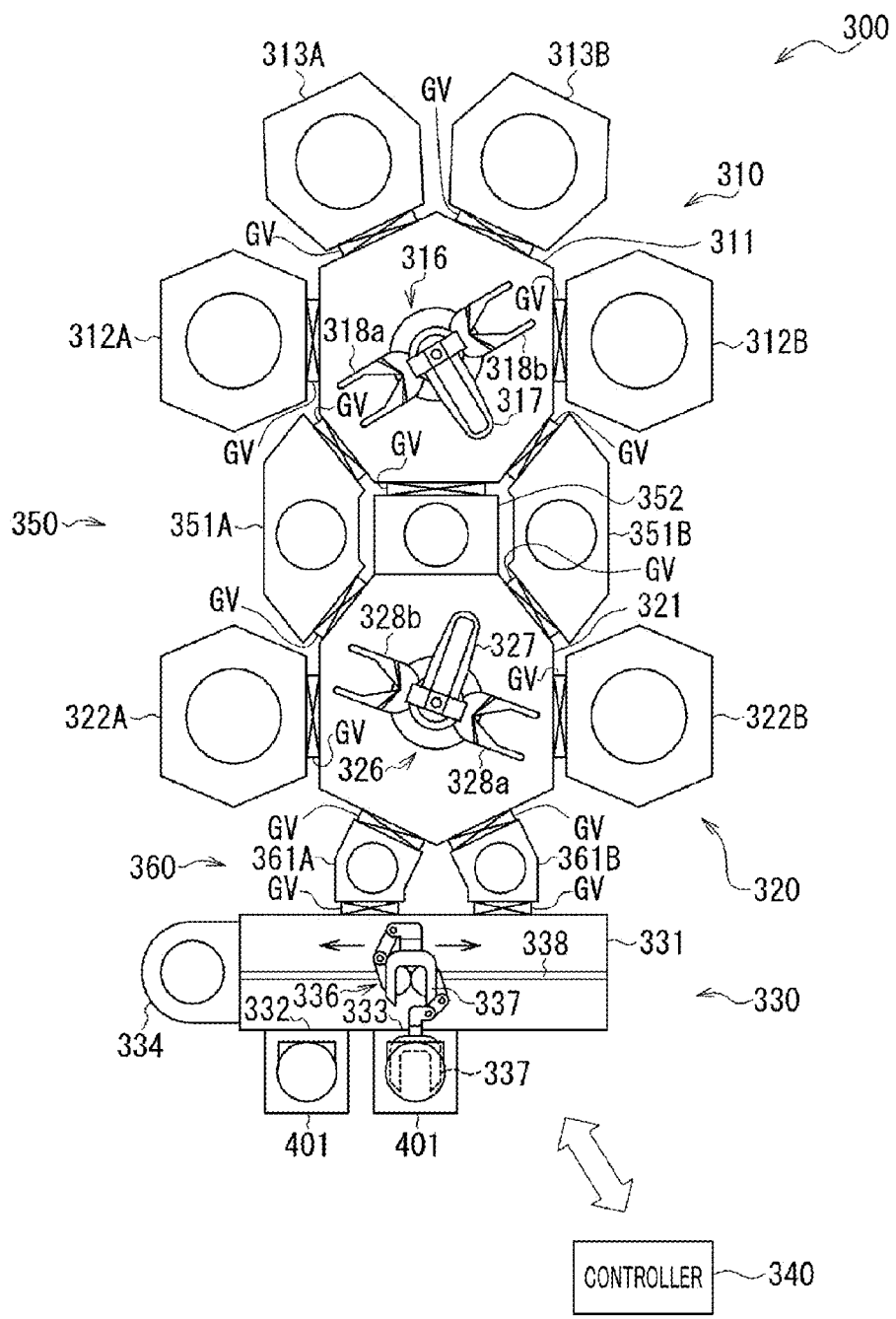
FIG. 19 is a plan view illustrating an example of a film forming system in which a copper wiring is formed.

Now, a film forming system suitable for performing a copper wiring forming method will be discussed. FIG. 19 is a plan view illustrating a film forming system configured to form a copper wiring as one exemplary embodiment of a semiconductor device manufacturing method of the present disclosure.

The film forming system 300 is configured to form a barrier film, a liner film and a copper film when forming a copper wiring on a wafer W. The film forming system 300 mainly includes a first film forming unit 310 configured to form a barrier film and a ruthenium film as a liner film; a second film forming unit 320 configured to form a copper film; a loader unit 330; and an overall controller 340. Further, the film forming system 300 also has a degas unit 350 configured to perform a degassing process on the wafer W; and a load lock unit 360 configured to transfer the wafer W in between the atmosphere pressure and the vacuum.

(First Film Forming Unit)

The first film forming unit 310 includes a first vacuum transfer chamber 311; and two barrier film forming devices 312A and 312B and two liner film forming devices 313A and 313B connected to the first vacuum transfer chamber 311. The liner film forming devices 313A and 313B have same configuration as the above-described film forming apparatus 100.

The inside of the first vacuum transfer chamber 311 is configured to be maintained in a preset vacuum atmosphere, and a first transfer device 316 configured to transfer the wafer W is provided within the first vacuum transfer chamber 311. The first transfer device 316 is provided at a substantially central portion of the first vacuum transfer chamber 311. Further, the first transfer device 316 is equipped with a rotating and extending/retracting unit 317 configured to be rotatable, extensible and contractible; and two supporting arms 318a and 318b provided at a leading end of the rotating and extending/retracting unit 317 to support the wafer W thereon. The first transfer device 316 carries the wafer W into or out of the barrier film forming devices 312A and 312B, the liner film forming devices 313A and 313B, degas chambers 351A and 315B, and a delivery chamber 352 to be described later.

(Second Film Forming Unit)

A second film forming unit 320 includes a second vacuum transfer chamber 321; and two copper film forming devices 322A and 322B connected to two facing walls of the second vacuum transfer chamber 321.

The inside of the second vacuum transfer chamber 321 is configured to be maintained in a predetermined vacuum atmosphere, and a second transfer device 326 is provided within the second vacuum transfer chamber 321. The second transfer device 326 is provided at a substantially central portion of the second vacuum transfer chamber 321 and is equipped with a rotating and extending/retracting unit 327 configured to be rotatable, extensible and contractible. Two supporting arms 328a and 328b configured to support the wafer W thereon are provided at a leading end of the rotating and extending/retracting unit 327. The two supporting arms 328a and 328b are fastened to the rotating/extending/retracting unit 327 to be arranged in opposite directions. The second transfer device 326 carries the wafer W into or out of the copper film forming devices 322A and 322B, the degas chambers 351A and 351B, load lock chambers 361A and 361B, and the delivery chamber 352 to be described later.

(Loader Unit)

The loader unit 330 is provided at the opposite side of the second film forming unit 320 with the load lock unit 360 therebetween. The loader unit 330 includes an atmospheric transfer chamber 331, and a filter (not shown) configured to form a downflow of clean air is provided at an upper portion of the atmospheric transfer chamber 331. Gate valves GV are provided between the load lock unit 360 and the atmospheric transfer chamber 331. Two connection ports 332 and 333 are provided at an opposite wall portion of the atmospheric transfer chamber 331 from the wall portion to which the load lock unit 360 is connected, and carriers 401 configured to accommodate wafers W therein are connected to the two connections ports 332 and 333, respectively. Further, an alignment chamber 334 in which alignment of the wafer W is performed is provided at a lateral side of the atmospheric transfer chamber 331. The atmospheric transfer chamber 331 has therein a third transfer device 336 for atmospheric transfer, and the third transfer device 336 is configured to perform carry-in/out of the wafers W into/from the carriers 401 and carry-in/out of the wafers W into/from the load lock unit 360. The third transfer device 336 has two multi-joint arms and is configured to be moved on a rail 338 along an arrangement direction of the carriers 401. This third transfer device 336 transfers the wafers W while holding the wafers W on leading-end hands 337 of the two multi-joint arms.

(Overall Controller)

The overall controller 340 is configured to control individual components of the film forming system 300, for example, the barrier film forming devices 312A and 312B, the liner film forming devices 313A and 313B, the copper film forming devices 322A and 322B, the transfer devices 316, 326 and 336, etc. That is, the overall controller 340 serves as a upper-level controller to a controller for controlling each of the individual components (for example, the controller 70 of the film forming apparatus 100) based on preset recipes. For example, a hardware configuration of the overall controller 340 may be the same as that of the controller 70 (see FIG. 2). The recipes may be stored in a recording medium, or may be appropriately transmitted from another apparatus via, e.g., a dedicated line. Based on the recipes, a desired process is performed in the film forming system 300 under the control of the overall controller 340.

(Degas Unit)

The degas unit 350 includes the degas chambers 351A and 351B configured to perform a degassing process on the wafer W; and the delivery chamber 352 configured to deliver the wafer W between the first vacuum transfer chamber 311 and the second vacuum transfer chamber 321. The degas chambers 351A and 351B are connected to the first vacuum transfer chamber 311. Further, the delivery chamber 352 is connected to walls of the first vacuum transfer chamber 311 and the second vacuum transfer chamber 321 between connection portions of the first vacuum transfer chamber 311 and the second vacuum transfer chamber 321 to the degas chambers 351A and 351B, respectively. That is, the delivery chamber 352 and the degas chambers 351A and 351B are all provided between the first vacuum transfer chamber 311 and the second vacuum transfer chamber 321, and the degas chambers 351A and 351B are arranged at two opposite sides of the delivery chamber 352.

(Load Lock Unit)

The load lock unit 360 includes the pair of load lock chambers 361A and 361B which are configured to be switched into between the atmospheric pressure and the vacuum. The load lock chambers 361A and 361B are connected to two wall portions of the second vacuum transfer chamber 321 at the side of the loader unit 330.

The barrier film forming devices 312A and 312B, the liner film forming devices 313A and 313B, the degas chambers 351A and 351B and the delivery chamber 352 are connected to respective walls of the first vacuum transfer chambers 311 via gate valves GV. The barrier film forming devices 312A and 312B, the liner film forming devices 313A and 313B, the degas chambers 351A and 351B and the delivery chamber 352 are allowed to communicate with or blocked from the first vacuum transfer chamber 311 as the corresponding gate valves GV are opened or closed.

The copper film forming devices 322A and 322B, the degas chambers 351A and 351B and the load lock chambers 361A and 361B are connected to the second vacuum transfer chamber 321 via gate valves GV. The copper film forming devices 322A and 322B, the degas chambers 351A and 351B and the load lock chambers 361A and 361B are allowed to communicate with the second vacuum transfer chamber 321 by opening the corresponding gate valves GV, and are blocked from the second vacuum transfer chamber 321 by closing the corresponding gate valves GV. Furthermore, the delivery chamber 352 is directly connected to the second vacuum transfer chamber 321 without gate valve GV therebetween.

(Film Forming Process)

In the film forming system 300, the wafer W having a preset pattern with a trench or a hole is taken out of corresponding one of the carriers 401 by the third transfer device 336 and is transferred into the load lock chamber 361A or 361B. After the inside of the load lock chamber 361A or 361B is depressurized to the same vacuum degree as that of the second vacuum transfer chamber 321, the wafer W within the load lock chamber 361A or 361B is transferred again into the degas chamber 351A or 351B by the second transfer device 326 via the second vacuum transfer chamber 321. Within the degas chamber 351A or 351B, a degassing process is performed on the wafer W. Thereafter, the wafer W within the degas chamber 351A or 351B is taken out by the first transfer device 316 and transferred into the barrier film forming device 312A or 312B via the first vacuum transfer chamber 311. In the barrier film forming device 312A or 312B, a barrier film is formed. Upon the completion of forming the barrier film, the wafer W is taken out of the barrier film forming device 312A or 312B by the first transfer device 316 and then is transferred into the liner film forming device 313A or 313B. In the liner film forming device 313A or 313B, the ruthenium film forming process is performed as described above.

After the ruthenium film is formed, the wafer W is taken out of the liner film forming device 313A or 313B by the first transfer device 316 and is transferred into the delivery chamber 352. Thereafter, the wafer W is taken out by the second transfer device 326 and transferred into the copper film forming device 322A or 322B via the second vacuum transfer chamber 321. In the copper film forming device 322A or 322B, a copper film is formed and the trench or the via is buried with copper. Here, besides this copper burying process within the copper film forming device 322A or 322B, a copper film may be additionally formed by, for example, the plating process at the outside of the film forming system 300.

After the copper film is formed, the wafer W is transferred into the load lock chamber 361A or 361B. After the inside of the load lock chamber 361A or 361B is returned back into the atmospheric pressure, the wafer W having the copper film formed thereon is taken out of the load lock chamber 361A or 361B by the third transfer device 336 and returned back into the carrier 401. These processes are performed as many times as the number of wafers W accommodated in the carrier.

According to this film forming system 300, the forming of the barrier film, the forming of the ruthenium film as the liner film, and the forming of the copper film can be performed in the vacuum state without being opened to the atmosphere. Thus, oxidation of the metal surfaces after the respective processes can be suppressed, so that a high-performance copper wiring can be obtained.

The series of processes from the forming of the barrier film to the forming of the copper film can be performed by the above-described film forming system 300. However, the annealing process and the CMP process conducted after the forming of the copper film may be performed on the wafer W unloaded from the film forming system 300 in apparatuses other than the film forming system 300. These apparatuses may be ones having typical configurations. Theses apparatuses and the film forming system 300 may constitute a copper wiring forming system and may be controlled by a common controller having the same function as the overall controller 340, and the copper wiring forming processes may be performed according to a single processing recipe.

The above-described exemplary embodiments are not limiting, and various changes and modifications may be made. By way of example, in the above-described exemplary embodiments, the ruthenium film formed according to the present disclosure serves as the liner film under the copper film when forming the copper wiring. However, the applicability of the ruthenium film is not limited thereto. Furthermore, the configurations of the apparatuses used in the above-described exemplary embodiments are nothing more than examples as well, and various other types of apparatuses can be used.

Furthermore, in the above description, the methods of the exemplary embodiments are applied to a wafer having a trench and a via (hole). However, the form or type of a recess is not limited to one having both the trench and the via.

In addition, the structure of the apparatus to which the methods according to the exemplary embodiments are applied may not be limited to the one described in the above exemplary embodiments.

Moreover, the processing target object is not also limited to the semiconductor wafer.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting.

I claim:

1. A ruthenium film forming method of forming a ruthenium film, comprising:
    a substrate loading process of placing a processing target substrate within a processing vessel of a film forming apparatus;
    a deposition process of generating a ruthenium carbonyl gas by supplying a CO gas as a carrier gas from a CO gas container configured to contain the CO gas into a film forming source container configured to contain ruthenium carbonyl in a solid state as a film forming source material, introducing a mixed gas of the ruthenium carbonyl gas and the CO gas into the processing vessel, and depositing metal ruthenium on a surface of the processing target substrate by decomposing the ruthenium carbonyl on the processing target substrate; and
    a CO gas introduction process of bringing the CO gas into contact with the metal ruthenium on the surface of the processing target substrate by introducing the CO gas directly into the processing vessel from the CO gas container after stopping the introducing of the mixed gas into the processing vessel.

2. The ruthenium film forming method of claim 1, wherein the deposition process and the CO gas introduction process are repeated multiple times.

3. The ruthenium film forming method of claim 2, wherein when a time period indicating a processing time during which the deposition process is performed single time is set to be T1 and a time period indicating a processing time during which the CO gas introduction process is performed single time is set to be T2, the T1 and the T2 satisfy a condition of T1<T2.

4. The ruthenium film forming method of claim 2, further comprising:
    a hydrogen gas introduction process of introducing a hydrogen gas into the processing vessel to bring the hydrogen gas into contact with the ruthenium film on the surface of the processing target substrate, after repeating the deposition process and the CO gas introduction process multiple times.

5. The ruthenium film forming method of claim 2, wherein the deposition process is conducted again until a preset film thickness is obtained, after repeating the deposition process and the CO gas introduction process multiple times.

6. The ruthenium film forming method of claim 2, wherein when a time period indicating a processing time during which the deposition process is performed single time is set to be T1 and a time period indicating a processing time during which the CO gas introduction process is performed single time is set to be T2, the T2 is shortened as the repetition number of the deposition process and the CO gas introduction process increases.

7. The ruthenium film forming method of claim 2, wherein when a time period indicating a processing time during which the deposition process is performed single time is set to be T1 and a time period indicating a processing time during which the CO gas introduction process is performed single time is set to be T2, the T1 is lengthened as the repetition number of the deposition process and the CO gas introduction process increases.

8. The ruthenium film forming method of claim 1, wherein a thickness of the ruthenium film is equal to or less than 2 nm.

9. A semiconductor device manufacturing method of manufacturing a semiconductor device having a copper wiring buried in an insulating film, the semiconductor device manufacturing method comprising:
    preparing a processing target substrate having an interlayer insulating film provided with an opening;
    forming a barrier film configured to suppress copper from being diffused on at least a surface of the opening of the processing target substrate;
    forming a ruthenium film on the barrier film; and
    burying copper serving as the copper wiring within the opening by forming a copper film on the ruthenium film,
    wherein the forming of the ruthenium film is performed by a ruthenium film forming method as claimed in claim 1.

10. The semiconductor device manufacturing method of claim 9,
    wherein the burying of the copper is performed by an ionized physical vapor deposition method.

11. The semiconductor device manufacturing method of claim 9, further comprising:
    removing the barrier film, the ruthenium film and the copper film formed on portions except the inside of the opening by chemical mechanical polishing to obtain the copper wiring, after the burying of the copper.

* * * * *